(12) United States Patent
Nishikori et al.

(10) Patent No.: US 10,824,073 B2
(45) Date of Patent: Nov. 3, 2020

(54) RADIATION-SENSITIVE RESIN COMPOSITION AND RESIST PATTERN-FORMING METHOD

(71) Applicant: JSR CORPORATION, Tokyo (JP)

(72) Inventors: Katsuaki Nishikori, Tokyo (JP); Hayato Namai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 106 days.

(21) Appl. No.: 16/043,283

(22) Filed: Jul. 24, 2018

(65) Prior Publication Data

US 2018/0329298 A1 Nov. 15, 2018

Related U.S. Application Data

(63) Continuation of application No. PCT/JP2016/089010, filed on Dec. 27, 2016.

(30) Foreign Application Priority Data

Jan. 25, 2016 (JP) .................. 2016-011946

(51) Int. Cl.

| | | |
|---|---|---|
| G03F 7/004 | (2006.01) | |
| G03F 7/039 | (2006.01) | |
| G03F 7/038 | (2006.01) | |
| G03F 7/16 | (2006.01) | |
| G03F 7/20 | (2006.01) | |
| G03F 7/32 | (2006.01) | |
| G03F 7/38 | (2006.01) | |
| C08F 12/22 | (2006.01) | |
| C09D 125/18 | (2006.01) | |
| C08F 2/48 | (2006.01) | |
| C08F 220/18 | (2006.01) | |
| C08F 220/28 | (2006.01) | |
| C08F 220/36 | (2006.01) | |
| C08F 220/38 | (2006.01) | |
| C08F 212/14 | (2006.01) | |
| C08F 220/16 | (2006.01) | |

(52) U.S. Cl.
CPC ............ *G03F 7/0045* (2013.01); *G03F 7/038* (2013.01); *G03F 7/039* (2013.01); *G03F 7/0397* (2013.01); *G03F 7/168* (2013.01); *G03F 7/2006* (2013.01); *G03F 7/2041* (2013.01); *G03F 7/322* (2013.01); *G03F 7/38* (2013.01); *C08F 2/48* (2013.01); *C08F 12/22* (2013.01); *C08F 212/14* (2013.01); *C08F 220/16* (2013.01); *C08F 220/18* (2013.01); *C08F 220/1806* (2020.02); *C08F 220/1807* (2020.02); *C08F 220/1808* (2020.02); *C08F 220/1809* (2020.02); *C08F 220/1811* (2020.02); *C08F 220/1812* (2020.02); *C08F 220/1818* (2020.02); *C08F 220/28* (2013.01); *C08F 220/281* (2020.02); *C08F 220/283* (2020.02); *C08F 220/36* (2013.01); *C08F 220/365* (2020.02); *C08F 220/38* (2013.01); *C08F 220/382* (2020.02); *C09D 125/18* (2013.01); *G03F 7/162* (2013.01)

(58) Field of Classification Search
None
See application file for complete search history.

(56) References Cited

U.S. PATENT DOCUMENTS

| | | | |
|---|---|---|---|
| 2009/0202945 A1 | 8/2009 | Nakagawa et al. | |
| 2012/0276483 A1* | 11/2012 | Ogihara | G03F 7/0752 430/319 |
| 2013/0045601 A1* | 2/2013 | Ogihara | G03F 7/091 438/694 |
| 2013/0284699 A1* | 10/2013 | Ogihara | G03F 7/0002 216/48 |

(Continued)

FOREIGN PATENT DOCUMENTS

| | | |
|---|---|---|
| JP | 2009-134088 A | 6/2009 |
| JP | 2010-32994 A | 2/2010 |

(Continued)

OTHER PUBLICATIONS

International Search Report dated Mar. 14, 2017 in PCT/JP2016/089010 (with English translation), 5 pages.

(Continued)

*Primary Examiner* — Cynthia Hamilton
(74) *Attorney, Agent, or Firm* — Oblon, McClelland, Maier & Neustadt, L.L.P.

(57) ABSTRACT

A radiation-sensitive resin composition includes a first compound represented by formula (1), a first polymer comprising an acid-labile group, and a radiation-sensitive acid generator other than the first compound. The radiation-sensitive acid generator includes an onium salt compound. In the formula (1), n is 2 or 3; m is 1 or 2; $Y^+$ represents a monovalent radiation-sensitive onium cation; and L represents a single bond or an organic group having a valency of n. L includes linking moieties each linking two of the carboxylate groups in formula (1). Number of atom(s) included in a linking moiety having a minimum number of bonds among the linking moieties is 0 to 10. In a case where L represents a single bond, n is 2, and in a case where n is 2, m is 1.

(1)

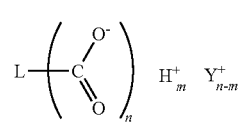

20 Claims, No Drawings

(56) References Cited

U.S. PATENT DOCUMENTS

| 2014/0162190 A1 | 6/2014 | Nakagawa et al. |
| 2016/0062237 A1 | 3/2016 | Nakagawa et al. |
| 2017/0199453 A1 | 7/2017 | Nakagawa et al. |

FOREIGN PATENT DOCUMENTS

| TW | 201403243 A | 1/2014 |
| WO | WO 2007/116664 A1 | 10/2007 |

OTHER PUBLICATIONS

Written Opinion of the International Searching Authority dated Mar. 14, 2017 in PCT/JP2016/089010 filed Dec. 27, 2016 (with English translation), 7 pages.

Office Action dated Jun. 3, 2020, in Taiwanese Patent Application No. 106100224, filed Jan. 5, 2017, (with English Translation).

\* cited by examiner

RADIATION-SENSITIVE RESIN COMPOSITION AND RESIST PATTERN-FORMING METHOD

CROSS-REFERENCE TO RELATED APPLICATIONS

The present application is a continuation application of International Application No. PCT/JP2016/089010, filed Dec. 2, 2016, which claims priority to Japanese Patent Application No. 2016-011946, filed Jan. 25, 2016. The contents of these applications are incorporated herein by reference in their entirety.

BACKGROUND OF THE INVENTION

Field of the Invention

The present invention relates to a radiation-sensitive resin composition and a resist pattern-forming method.

Discussion of the Background

A chemically amplified radiation-sensitive resin compositions for use in microfabrication by lithography generates an acid upon irradiation with a far ultraviolet ray such as an ArF excimer laser beam, a charged particle ray such as an electron beam, or the like at a light-exposed region. A chemical reaction in which the acid serves as a catalyst causes the difference in rates of dissolution in a developer solution, between light-exposed regions and light-unexposed regions to form a resist pattern.

In forming such a resist pattern, a liquid immersion lithography process is suitably employed for forming a still finer resist pattern. An exposure is carried out in this process by filling a space between an exposure lens and the resist film with a liquid immersion medium having a greater refractive index than the air or an inert gas. This liquid immersion lithography process is advantageous in that, even in a case where a numerical aperture of the lens is increased, the depth of focus is less likely to decrease, and a high resolution is attainable.

Proposed radiation-sensitive resin compositions for use in such a liquid immersion lithography process include: a radiation-sensitive resin composition containing a highly water repellent fluorine atom-containing polymer in an attempt to inhibit elution of a radiation-sensitive acid generator and the like from the resist film into a liquid immersion medium and to improve water draining of the resist film (see PCT International Publication No. 2007/116664); and further a radiation-sensitive resin composition containing a fluorine atom-containing polymer that includes an alkali-labile group that is water repellent during liquid immersion lithography and to become hydrophilic through generating a carboxy group during a development with an alkali, aiming at inhibition of development defects and the like at light-unexposed regions upon acquisition of water repellency of the resist film (see Japanese Unexamined Patent Application, Publication No. 2010-32994). According to the fluorine atom-containing polymer that includes an alkali-labile group, development defects such as blob defects resulting from adhesion of residues, for example, can be reportedly decreased as a result of an increase in the affinity with an alkaline developer solution and/or a rinse agent.

Such a radiation-sensitive resin composition typically contains an acid diffusion control agent for the purpose of improving lithography performances such as resolution, rectangularity of the cross-sectional shape and LWR (Line Width Roughness) performances of the resultant resist pattern. Among such acid diffusion control agents, an onium salt compound constituted with a radioactive ray-degradable onium cation and a weak acid anion exhibits superior acid diffusion controllability since an acid capturing ability is lost at light-exposed regions and the acid capturing ability is exerted only at light-unexposed regions, thereby enabling the lithography performances to be more improved.

SUMMARY OF THE INVENTION

According to one aspect of the present invention, a radiation-sensitive resin composition includes a first compound represented by formula (1), a first polymer comprising an acid-labile group, and a radiation-sensitive acid generator other than the first compound. The radiation-sensitive acid generator includes an onium salt compound. In the formula (1), n is 2 or 3; m is 1 or 2; $Y^+$ represents a monovalent radiation-sensitive onium cation; and L represents a single bond or an organic group having a valency of n. L includes linking moieties each linking two of the carboxylate groups in formula (1). Number of atom(s) included in a linking moiety having a minimum number of bonds among the linking moieties is 0 to 10. In a case where L represents a single bond, n is 2, and in a case where n is 2, m is 1.

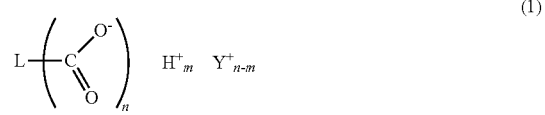

(1)

According to another aspect of the present invention, a resist pattern-forming method includes forming a resist film from the radiation-sensitive resin composition, exposing the resist film, and developing the resist film exposed.

DESCRIPTION OF EMBODIMENTS

According to an embodiment of the invention, a radiation-sensitive resin composition contains: a first compound (hereinafter, may be also referred to as "(A) compound" or "compound (A)") represented by the following formula (1); a first polymer (hereinafter, may be also referred to as "(B) polymer" or "polymer (B)") that includes an acid-labile group; a radiation-sensitive acid generator (hereinafter, may be also referred to as "(C) acid generator" or "acid generator (C)") other than the compound (A), the acid generator (C) containing an onium salt compound.

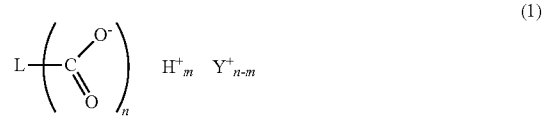

(1)

In the formula (1), n is 2 or 3; L represents a single bond or an organic group having a valency of n, and among linking moieties each linking two of carboxylate groups, number of atom(s) included in a linking moiety having a minimum number of bonds is 0 to 10, wherein in a case where L represents a single bond, n is 2; m is 1 or 2, wherein in a case where n is 2, m is 1; and Y⁺ represents a monovalent radiation-sensitive onium cation.

According to another embodiment of the invention, a resist pattern-forming method includes: forming a resist film; exposing the resist film; and developing the resist film exposed, in which the resist film is formed from the radiation-sensitive resin composition of the first aspect.

The "linking moiety" in the phrase "among linking moieties each linking two of carboxylate groups, number of atom(s) included in a linking moiety having a minimum number of bonds" as referred to means a bonding path that links two groups among a plurality of carboxylate groups. Further, the "number of bonds" as referred to means the number of bonds between two adjacent atoms in the linking moiety that links two of the carboxylate groups, and irrespective of the bond order, one bond between two adjacent atoms is counted as one bond. In these regards, the "atom(s) included in a linking moiety having a minimum number of bonds" does not include atoms of the carboxylate groups positioned at both two ends of the linking moiety.

The "organic group" as referred to herein means a group having at least one carbon atom.

According to the radiation-sensitive resin composition and the resist pattern-forming method of embodiments of the present invention, forming a resist pattern superior in storage stability and inhibitory ability of development defects is enabled while a favorable MEEF performance is maintained. Therefore, these can be suitably used in pattern formation for manufacture of semiconductor devices in which further progress of miniaturization is expected.

Radiation-Sensitive Resin Composition

The radiation-sensitive resin composition of an embodiment of the present invention contains the compound (A), the polymer (B) and the acid generator (C). The radiation-sensitive resin composition may contain as favorable components, a second polymer (hereinafter, may be also referred to as "(D) polymer" or "polymer (D)") having the total percentage content by mass of fluorine atoms and silicon atoms greater than the polymer (B), and the solvent (E). Moreover, the radiation-sensitive resin composition may contain other optional component(s) within a range not leading to impairment of the effects of the present invention.

Hereinafter, each component will be explained.

(A) Compound

The compound (A) has a structure represented by the following formula (1). Owing to the use of the compound (A) as the onium salt compound serving as an acid diffusion control agent, superior storage stability and inhibitory ability of development defects of the radiation-sensitive resin composition of the embodiment are enabled while a favorable MEEF performance is maintained.

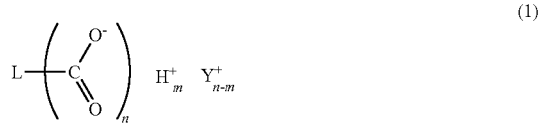

(1)

In the above formula (1), n is 2 or 3; L represents a single bond or an organic group having a valency of n, and among linking moieties each linking two of carboxylate groups, number of atom(s) included in a linking moiety having a minimum number of bonds is 0 to 10, wherein in a case where L represents a single bond, n is 2; m is 1 or 2, wherein in a case where n is 2, m is 1; and Y⁺ represents a monovalent radiation-sensitive onium cation.

The monovalent organic group which may be represented by L is exemplified by: a monovalent hydrocarbon group; a group (q) that includes a divalent hetero atom-containing group between two adjacent carbon atoms, or at the end of the atomic bonding side of the monovalent hydrocarbon group; a group obtained from the monovalent hydrocarbon group and the group (q) by substituting with a monovalent hetero atom-containing group a part or all of hydrogen atoms included therein; and the like.

Exemplary monovalent hydrocarbon groups include a chain hydrocarbon group, an alicyclic hydrocarbon group, an aromatic hydrocarbon group, and the like.

Examples of the chain hydrocarbon group include:

alkyl groups such as a methyl group, an ethyl group, a n-propyl group, an i-propyl group, a n-butyl group, an i-butyl group, a sec-butyl group and a t-butyl group;

alkenyl groups such as an ethenyl group, a propenyl group and a butenyl group;

alkynyl groups such as an ethynyl group, a propynyl group and a butynyl group; and the like.

Examples of the alicyclic hydrocarbon group include:

monocyclic cycloalkyl groups such as a cyclopropyl group, a cyclobutyl group, a cyclopentyl group, a cyclohexyl group and a cyclooctyl group;

monocyclic cycloalkenyl groups such as a cyclobutenyl group, a cyclopentenyl group and a cyclohexenyl group;

polycyclic cycloalkyl groups such as a norbornyl group, an adamantyl group, a tricyclodecyl group and a tetracyclododecyl group;

polycyclic cycloalkenyl groups such as a norbornenyl group, a tricyclodecenyl group and a tetracyclododecenyl group, and the like.

Examples of the aromatic hydrocarbon group include:

aryl groups such as a phenyl group, a tolyl group, a xylyl group, a naphthyl group and an anthryl group;

aralkyl groups such as a benzyl group, a phenethyl group, a phenylpropyl group and a naphthylmethyl group, and the like.

Examples of hetero atom which may be included in the monovalent or divalent hetero atom-containing group include an oxygen atom, a sulfur atom, a nitrogen atom, a silicon atom and a phosphorus atom, halogen atoms such as a fluorine atom, a chlorine atom and a bromine atom, and the like. Of these, an oxygen atom, a sulfur atom, a nitrogen atom and a halogen atom are preferred, and an oxygen atom and a fluorine atom are more preferred.

Examples of the divalent hetero atom-containing group include —O—, —CO—, —CS—, —NR'—, groups obtained by combining the same, and the like. R' represents a hydrogen atom or a monovalent hydrocarbon group having 1 to 10 carbon atoms.

Examples of the monovalent hetero atom-containing group include a hydroxy group, a carboxy group, a sulfanyl group (—SH), an amino group, a cyano group, a halogen atom, and the like.

The reason for achieving the aforementioned effects due to the constitution of the radiation-sensitive resin composition of the embodiment is not necessarily clarified and without wishing to be bound by any theory; however, although precipitation of a hardly soluble salt through e.g., a degradative reaction with a polymer is inevitable when, for example, a conventional onium salt compound is included as the acid diffusion control agent, it is considered that the compound (A) would lead to inhibition of the precipitation which may result from appropriately low nucleophilicity caused by the structure of the formula (1), and consequently the storage stability and the inhibitory ability of development defects of the radiation-sensitive resin composition are improved. In addition, since the compound (A) as the acid diffusion control agent has the specific structure represented by the formula (1) and thus has appropriately high polarity, a more appropriate decrease in the diffusion length of an acid generated from the acid generator in the resist film is enabled. The radiation-sensitive resin composition is considered to enable the favorable MEEF performance to be maintained owing to the inhibition of the precipitation, and to the control of the diffusion length of the acid.

L represents preferably a single bond or a substituted or unsubstituted divalent hydrocarbon group having 1 to 20 carbon atoms, in light of more improvements of the storage stability and the inhibitory ability of development defects of the radiation-sensitive resin composition.

The monovalent hydrocarbon group having 1 to 20 carbon atoms is exemplified by a chain hydrocarbon group having 1 to 20 carbon atoms, an alicyclic hydrocarbon group having 3 to 20 carbon atoms, an aromatic hydrocarbon group having 6 to 20 carbon atoms, and the like.

Examples of the chain hydrocarbon group include:

alkyl groups such as a methyl group, an ethyl group, a n-propyl group, an i-propyl group, a n-butyl group, an i-butyl group, a sec-butyl group and a t-butyl group;

alkenyl groups such as an ethenyl group, a propenyl group and a butenyl group;

alkynyl groups such as an ethynyl group, a propynyl group and a butynyl group; and the like.

Examples of the alicyclic hydrocarbon group include:

monocyclic cycloalkyl groups such as a cyclopropyl group, a cyclobutyl group, a cyclopentyl group, a cyclohexyl group and a cyclooctyl group;

monocyclic cycloalkenyl groups such as a cyclobutenyl group, a cyclopentenyl group and a cyclohexenyl group;

polycyclic cycloalkyl groups such as a norbornyl group, an adamantyl group, a tricyclodecyl group and a tetracyclododecyl group;

norbornenyl groups such as a tricyclodecenyl group and a tetracyclododecenyl group; and the like.

Examples of the aromatic hydrocarbon group include:

aryl groups such as a phenyl group, a tolyl group, a xylyl group, a naphthyl group and an anthryl group;

aralkyl groups such as a benzyl group, a phenethyl group, a phenylpropyl group and a naphthylmethyl group; and the like.

In light of more improvements of the storage stability and the inhibitory ability of development defects of the radiation-sensitive resin composition, L represents preferably a single bond or a group including 0 to 10 atom(s) in a linking moiety having a minimum number of bonds among the linking moieties each linking two of carboxylate groups, and more preferably a group including 1 or 2 atom(s) in a linking moiety having a minimum number of bonds among the linking moieties each linking two of carboxylate groups.

Moreover, in light of more improvements of the storage stability and the inhibitory ability of development defects of the radiation-sensitive resin composition, it is preferred that n is 2, and L represents a substituted or unsubstituted 1,2-benzenediyl group or a substituted or unsubstituted 1,2-ethenediyl group.

The monovalent radiation-sensitive onium cation represented by $Y^+$ is exemplified by a radiation-sensitive onium cation that includes an element such as S, I, O, N, P, Cl, Br, F, As, Se, Sn, Sb, Te or Bi. An exemplary cation that includes S (sulfur) as an element is a sulfonium cation, a tetrahydrothiophenium cation or the like, and an exemplary cation that includes I (iodine) as an element is an iodonium cation or the like.

Examples of $Y^+$ include a cation represented by the following formula (Q-1) (hereinafter, may be also referred to as "cation (Q-1)"), a cation represented by the following formula (Q-2) (hereinafter, may be also referred to as "cation (Q-2)"), a cation represented by the following formula (Q-3) (hereinafter, may be also referred to as "cation (Q-3)"), and the like.

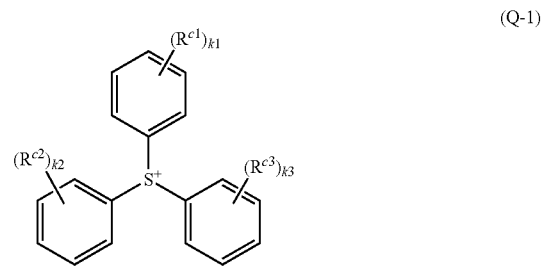

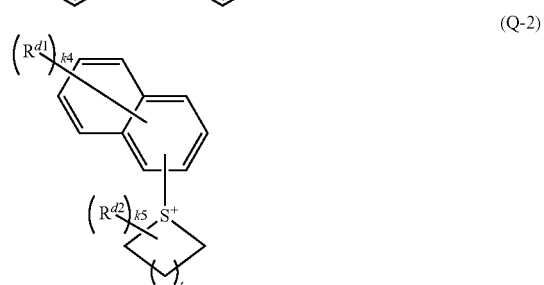

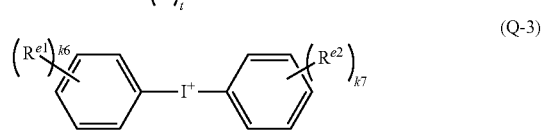

In the above formula (Q-1), and $R^{c1}$, $R^{c2}$ and $R^{c3}$ each independently represent a substituted or unsubstituted linear or branched alkyl group having 1 to 12 carbon atoms, a substituted or unsubstituted aromatic hydrocarbon group having 6 to 12 carbon atoms, $-OSO_2-R^{P'}$ or $-SO_2-R^{Q'}$, or at least two of $R^{c1}$, $R^{c2}$ and $R^{c3}$ taken together represent a ring structure; $R^{P'}$ and $R^{Q'}$ each independently represent a substituted or unsubstituted linear or branched alkyl group having 1 to 12 carbon atoms, a substituted or unsubstituted alicyclic hydrocarbon group having 5 to 25 carbon atoms or a substituted or unsubstituted aromatic hydrocarbon group having 6 to 12 carbon atoms; and k1, k2 and k3 are each independently an integer of 0 to 5, wherein in a case where $R^{c1}$ to $R^{c3}$ and $R^{P'}$ and $R^{Q'}$ are each present in a plurality of number, a plurality of $R^{c1}$s may be identical or different, a plurality of $R^{c2}$s may be identical or different, a plurality of $R^{c3}$s may be identical or different, a plurality of $R^{P'}$s may be identical or different, and a plurality of $R^{Q'}$s may be identical or different.

In the above formula (Q-2), $R^{d1}$ represents a substituted or unsubstituted linear or branched alkyl group having 1 to 8 carbon atoms, or a substituted or unsubstituted aromatic hydrocarbon group having 6 to 8 carbon atoms; k4 is an integer of 0 to 7, wherein in a case where $R^{d1}$ is present in a plurality of number, a plurality of $R^{d1}$s may be identical or different, or a plurality of $R^{d1}$s may taken together represent a ring structure; $R^{d2}$ represents a substituted or unsubstituted linear or branched alkyl group having 1 to 7 carbon atoms, or a substituted or unsubstituted aromatic hydrocarbon group having 6 or 7 carbon atoms; k5 is an integer of 0 to 6, wherein in a case where $R^{d2}$ is present in a plurality of number, a plurality of $R^{d2}$s may be identical or different, or a plurality of $R^{d2}$s may taken together represent a ring structure; and t is an integer of 0 to 3.

In the above formula (Q-3), $R^{e1}$ and $R^{e2}$ each independently represent a substituted or unsubstituted linear or branched alkyl group having 1 to 12 carbon atoms, a substituted or unsubstituted aromatic hydrocarbon group having 6 to 12 carbon atoms, $—OSO_2—R^R$ or $—SO_2—R^S$, or at least two of $R^{e1}$ and $R^{e2}$ taken together represent a ring structure, or $R^R$ and $R^S$ each independently represent a substituted or unsubstituted linear or branched alkyl group having 1 to 12 carbon atoms, a substituted or unsubstituted alicyclic hydrocarbon group having 5 to 25 carbon atoms or a substituted or unsubstituted aromatic hydrocarbon group having 6 to 12 carbon atoms; and k6 and k7 are each independently an integer of 0 to 5, wherein in a case where $R^{e1}$, $R^{e2}$, $R^R$ and $R^S$ are each present in a plurality of number, a plurality of $R^{e1}$s may be identical or different, a plurality of $R^{e2}$s may be identical or different, a plurality of $R^R$s may be identical or different, and a plurality of $R^S$s may be identical or different.

Examples of the unsubstituted linear alkyl group which may be represented by $R^{c1}$ to $R^{c3}$, $R^{d1}$, $R^{d2}$, $R^{e1}$ and $R^{e2}$ include a methyl group, an ethyl group, a n-propyl group, a n-butyl group, and the like.

Examples of the unsubstituted branched alkyl group which may be represented by $R^{c1}$ to $R^{c3}$, $R^{d1}$, $R^{d2}$, $R^{e1}$ and $R^{e2}$ include an i-propyl group, an i-butyl group, a sec-butyl group, a t-butyl group, and the like.

Examples of the unsubstituted aromatic hydrocarbon group which may be represented by $R^{c1}$ to $R^{c3}$, $R^{e1}$ and $R^{e2}$ include: aryl groups such as a phenyl group, a tolyl group, a xylyl group, a mesityl group and a naphthyl group; aralkyl groups such as a benzyl group and a phenethyl group; and the like.

Examples of unsubstituted aromatic hydrocarbon group which may be represented by $R^{d1}$ and $R^{d2}$ include a phenyl group, a tolyl group, a benzyl group, and the like.

Examples of the substituent which may substitute for the hydrogen atom included in the alkyl group and the aromatic hydrocarbon group include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like. Of these, the halogen atoms are preferred, and a fluorine atom is more preferred.

$R^{c1}$ to $R^{c3}$, $R^{d1}$, $R^{d2}$, $R^{e1}$ and $R^{e2}$ each preferably represent an unsubstituted linear or branched alkyl group, a fluorinated alkyl group, an unsubstituted monovalent aromatic hydrocarbon group, $—OSO_2—R^{}$, $—SO_2—R^{}$, more preferably a fluorinated alkyl group, an unsubstituted monovalent aromatic hydrocarbon group, and still more preferably a fluorinated alkyl group. $R^{**}$ represents preferably an unsubstituted monovalent alicyclic hydrocarbon group or an unsubstituted monovalent aromatic hydrocarbon group.

In the above formula (Q-1), k1, k2 and k3 are each preferably an integer of 0 to 2, more preferably 0 or 1, and still more preferably 0. In the above formula (Q-2), k4 is preferably an integer of 0 to 2, more preferably 0 or 1, and still more preferably 1. In the formula (Q-2), k5 is preferably an integer of 0 to 2, more preferably 0 or 1, and still more preferably 0. In the above formula (Q-3), k6 and k7 are each preferably an integer of 0 to 2, more preferably 0 or 1, and still more preferably 0.

Examples of the cation (Q-1) include cations represented by the following formulae (i-1) to (i-21), and the like.

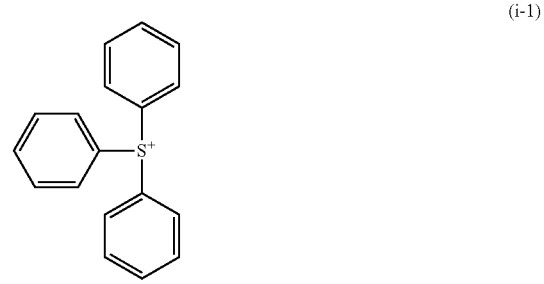

(i-1)

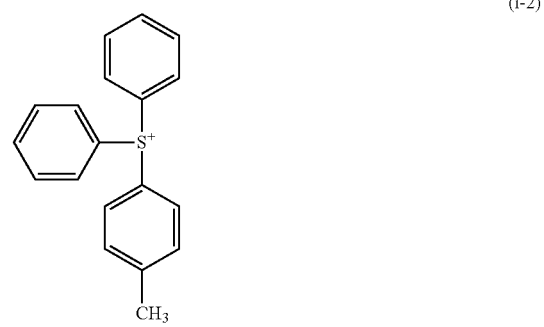

(i-2)

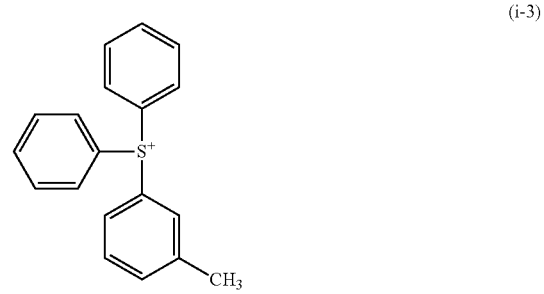

(i-3)

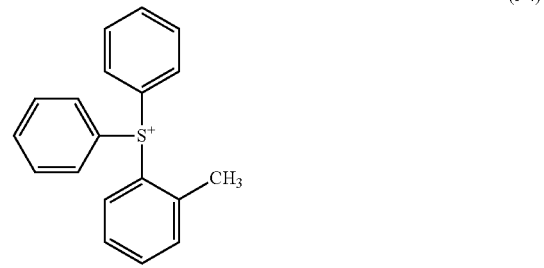

(i-4)

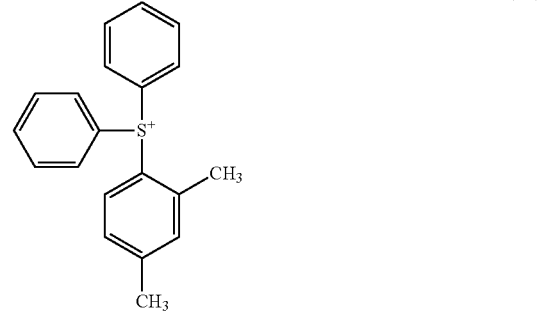

(i-5)

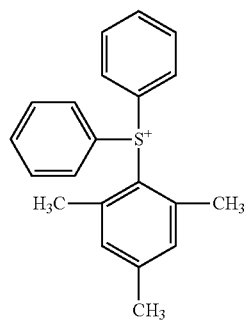
(i-6)
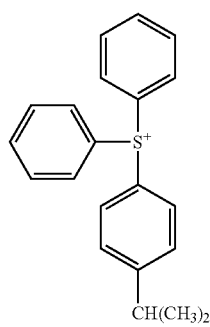
(i-10)
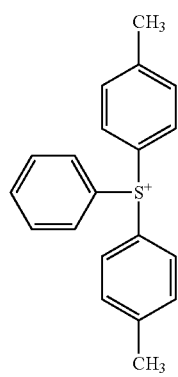
(i-7)
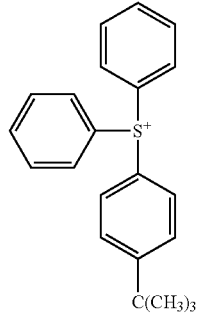
(i-11)
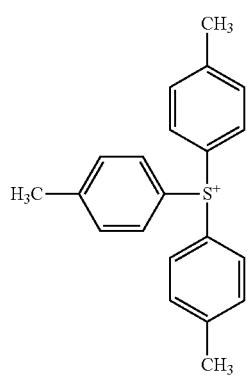
(i-8)
(i-12)
(i-9)
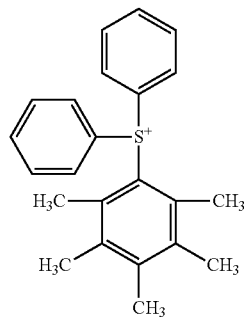
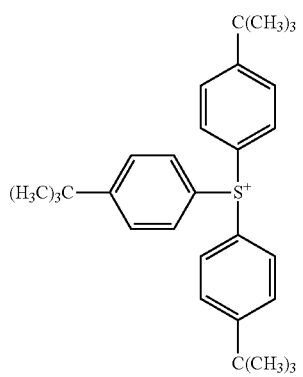
(i-13)

(i-14)
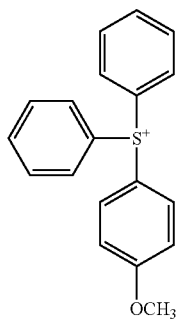
(i-15)
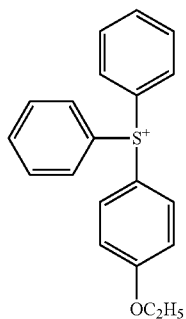
(i-16)
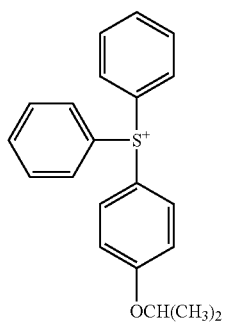
(i-17)
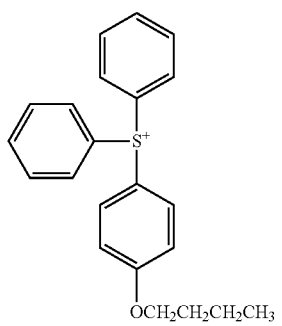
(i-18)
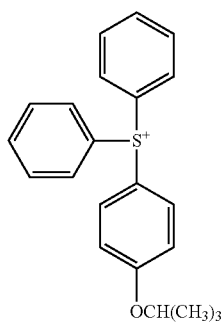
(i-19)
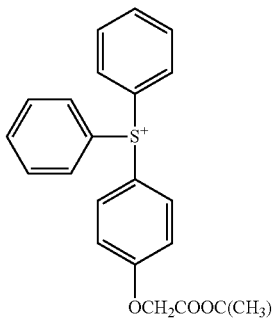
(i-20)
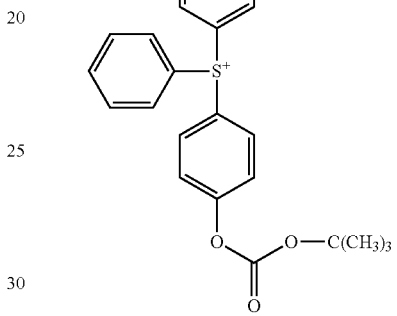
(i-21)
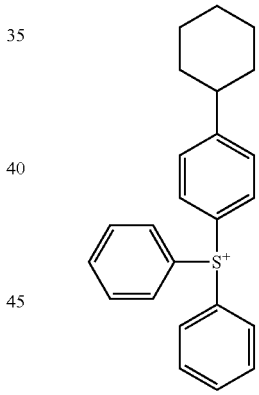
Of these, the cation represented by the above formula (i-1) and the cation represented by the above formula (i-21) are preferred.
Examples of the cation (Q-2) include cations represented by the following formulae (i'-1) to (i'-4), and the like.
(i'-1)
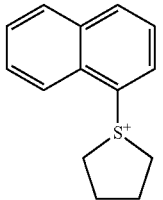

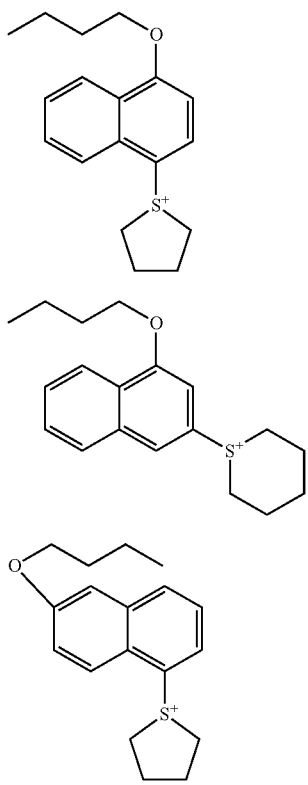
Of these, the cation represented by the above formula (i'-2) is preferred.
Examples of the cation (Q-3) include cations represented by the following formulae (ii-1) to (ii-25), and the like.
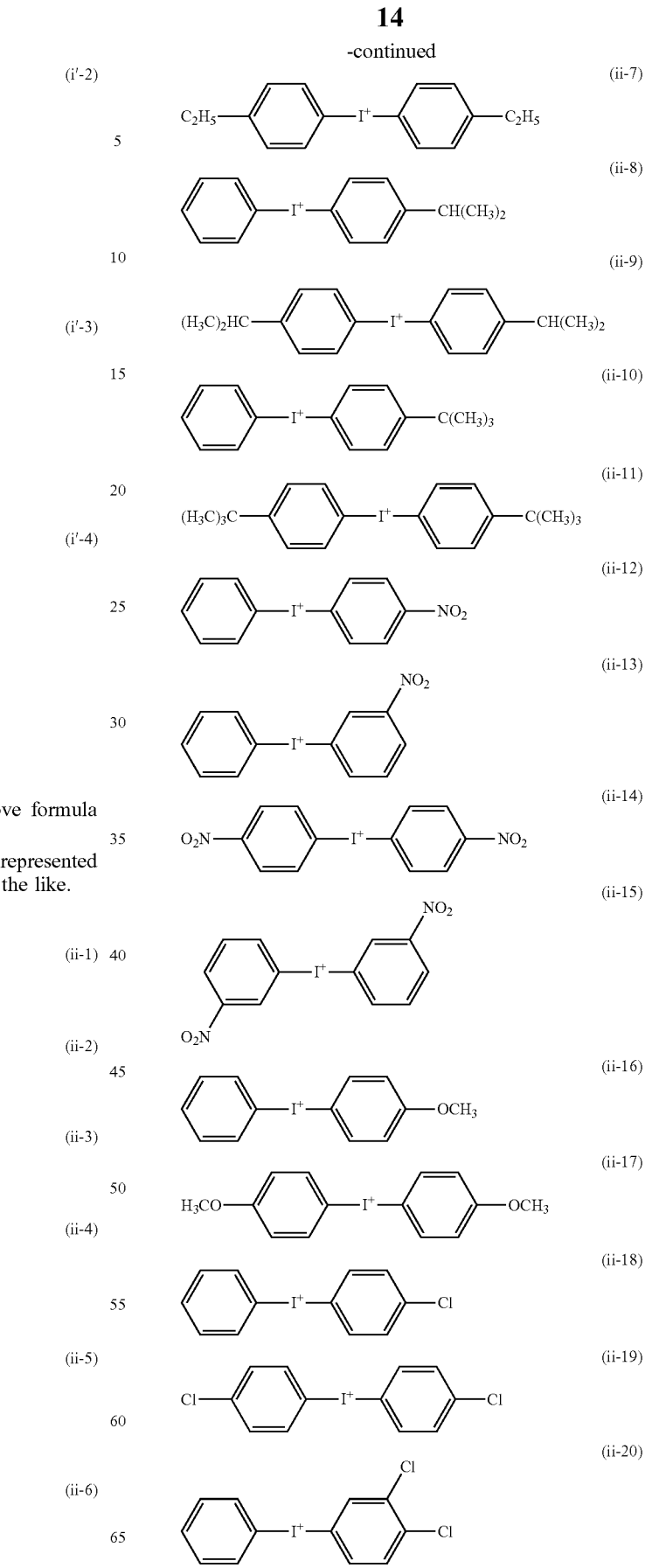

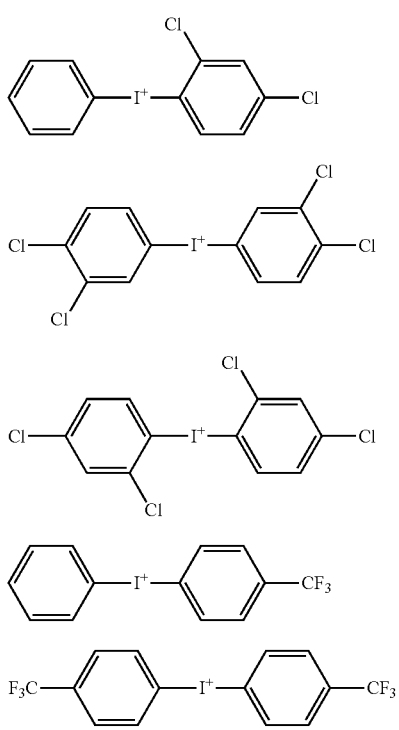
Of these, the cation represented by the above formula (ii-11) is preferred.
Examples of the compound (A) include compounds represented by the following formulae (A-1) to (A-18) (hereinafter, may be also referred to as "compound (A-1) to compound (A-18)"), and the like.
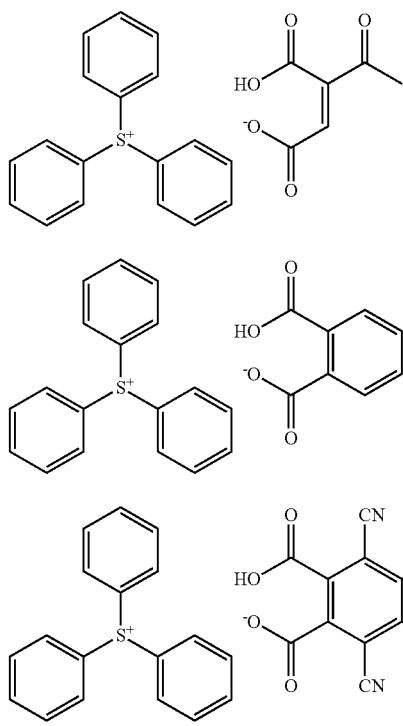

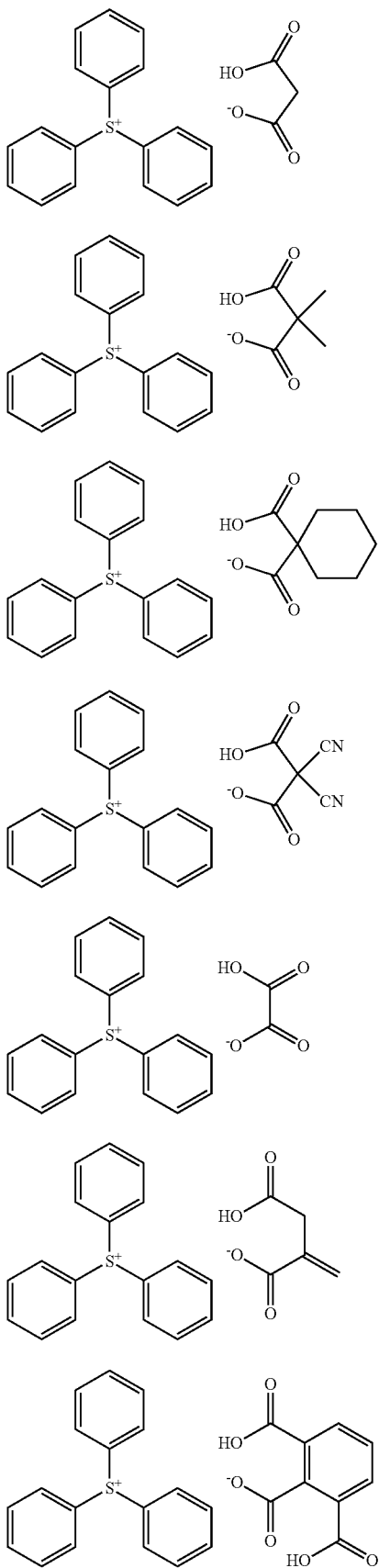
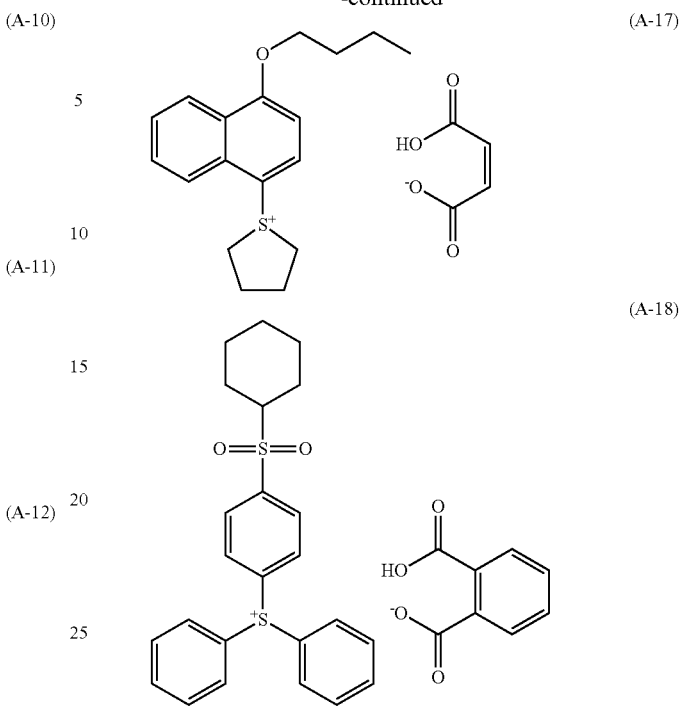

Of these, the compound (A) is preferably the compound (A-1), and more preferably the compound (A-5) and the compound (A-7).

The lower limit of the content of the compound (A) with respect to the total solid content of the radiation-sensitive resin composition is preferably 0.1% by mass, more preferably 0.5% by mass, still more preferably 1% by mass, and particularly preferably 3% by mass. The upper limit of the content in the total solid content is preferably 30% by mass, more preferably 20% by mass, still more preferably 15% by mass, and particularly preferably 10% by mass. In a case where the content of the compound (A) is less than the lower limit, lithography performances such as resolution of the radiation-sensitive resin composition may be impaired. In a case where the content of the compound (A) is greater than the upper limit, sensitivity of the radiation-sensitive resin composition may be decreased. The "total solid content" as referred to herein means components other than the solvent of the radiation-sensitive resin composition.

The lower limit of the content the compound (A) with respect to 100 parts by mass of the polymer (B) described later is preferably 0.1 parts by mass, more preferably 0.5 parts by mass, still more preferably 1 part by mass, and particularly preferably 3 parts by mass. The upper limit of the content of the compound (A) with respect to 100 parts by mass of the polymer (B) is preferably 30 parts by mass, more preferably 20 parts by mass, still more preferably 15 parts by mass, and particularly preferably 10 parts by mass.

(B) Polymer

The polymer (B) includes an acid-labile group. The polymer (B) typically serves as a base polymer in the radiation-sensitive resin composition. The "base polymer" as referred to herein means a polymer to be a principal component among polymers constituting the resist pattern, the polymer accounting for preferably no less than 50% by mass, and more preferably no less than 60% by mass.

In addition to a structural unit that includes the acid-labile group (hereinafter, may be also referred to as "structural unit (IV)"), the polymer (B) preferably has a structural unit (V) that includes at least one selected from the group consisting of a lactone structure, a cyclic carbonate structure and a sultone structure, and may have other structural unit except for these structural units. The polymer (B) may have one, or two or more of these structural units.

Structural Unit (IV)

The structural unit (IV) includes the acid-labile group. Due to the polymer (B) having the structural unit (IV), the radiation-sensitive resin composition exhibits improved sensitivity and resolution, thereby consequently enabling the lithography performances to be improved. The "acid-labile group" as referred to herein means a group that will substitute for the hydrogen atom included in the carboxy group, a hydroxy group and the like, the group being to be dissociated by an action of an acid.

Examples of the structural unit (IV) include a structural unit represented by the following formula (4) (hereinafter, may be also referred to as "structural unit (IV-1)"), and the like. The group represented by —CR$^5$R$^6$R$^7$ in the formula (4) for the structural unit (IV-1) corresponds to the acid-labile group.

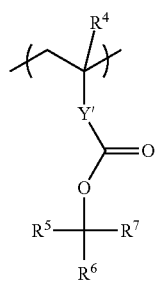

(4)

In the above formula (4), R$^4$ represents a hydrogen atom, a fluorine atom, a methyl group or a trifluoromethyl group; Y' represents a single bond, a carbonyloxyalkanediyl group having 2 to 20 carbon atoms, a carbonyloxycycloalkanediyl group having 4 to 20 carbon atoms, a carbonyloxycycloalkanediyloxy group having 4 to 20 carbon atoms, an arenediyl group having 6 to 20 carbon atoms or a carbonyloxyarenediyl group having 7 to 20 carbon atoms; R$^5$ represents a hydrogen atom, a monovalent chain hydrocarbon group having 1 to 20 carbon atoms, a monovalent alicyclic hydrocarbon group having 3 to 20 carbon atoms or an aromatic hydrocarbon group having 6 to 20 carbon atoms; and R$^6$ and R$^7$ each independently represent a monovalent chain hydrocarbon group having 1 to 20 carbon atoms or a monovalent alicyclic hydrocarbon group having 3 to 20 carbon atoms, or R$^6$ and R$^7$ taken together represent an alicyclic structure having 3 to 20 ring atoms together with the carbon atom to which R$^6$ and R$^7$ bond.

Examples of the carbonyloxyalkanediyl group having 2 to 20 carbon atoms which may be represented by Y' include a carbonyloxymethanediyl group, a carbonyloxyethanediyl group, a carbonyloxypropanediyl group, and the like.

Examples of the carbonyloxycycloalkanediyl group having 4 to 20 carbon atoms which may be represented by Y' include:

monocyclic carbonyloxycycloalkanediyl groups such as a carbonyloxycyclopropanediyl group, a carbonyloxycyclobutanediyl group, a carbonyloxycyclopentanediyl group and a carbonyloxycyclohexanediyl group;

polycyclic carbonyloxycycloalkanediyl groups such as a carbonyloxynorbornanediyl group, a carbonyloxyadamantanediyl group, a carbonyloxytricyclodecanediyl group and a carbonyloxytetracyclododecanediyl group, and the like.

Examples of the carbonyloxycycloalkanediyloxy group having 4 to 20 carbon atoms which may be represented by Y' include:

monocyclic carbonyloxycycloalkanediyloxy groups such as a carbonyloxycyclopropanediyloxy group, a carbonyloxycyclobutanediyloxy group, a carbonyloxycyclopentanediyloxy group and a carbonyloxycyclohexanediyloxy group;

polycyclic carbonyloxycycloalkanediyloxy groups such as a carbonyloxynorbornanediyloxy group, a carbonyloxyadamantanediyloxy group, a carbonyloxytricyclodecanediyloxy group and a carbonyloxytetracyclododecanediyloxy group; and the like.

Examples of the arenediyl group having 6 to 20 carbon atoms which may be represented by Y' include:

a benzenediyl group, a toluenediyl group, a xylene diyl group, a mesitylenediyl group, a naphthalenediyl group, an anthracenediyl group, and the like.

Examples of the carbonyloxyarenediyl group having 6 to 20 carbon atoms which may be represented by Y' include:

a carbonyloxybenzenediyl group, a carbonyloxytoluenediyl group, a carbonyloxyxylenediyl group, a carbonyloxymesitylenediyl group, a carbonyloxynaphthalenediyl group, a carbonyloxyanthracenediyl group, and the like.

Y' represents preferably a single bond, the carbonyloxyalkanediyl group having 2 to 20 carbon atoms, the carbonyloxycycloalkanediyloxy group having 4 to 20 carbon atoms, or the arenediyl group having 6 to 20 carbon atoms, more preferably a single bond, a carbonyloxymethanediyl group, a polycyclic carbonyloxycycloalkanediyloxy group or a benzenediyl group, and still more preferably a single bond or a carbonyloxymethanediyl group.

In light of a degree of copolymerization of a monomer that gives the structural unit (IV), R$^4$ represents preferably a hydrogen atom or a methyl group, and more preferably a methyl group.

Examples of the monovalent chain hydrocarbon group having 1 to 10 carbon atoms which may be represented by R$^5$, R$^6$ and R$^7$ include:

alkyl groups such as a methyl group, an ethyl group, a n-propyl group and an i-propyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms which may be represented by R$^5$, R$^6$ and R$^7$ include:

monocyclic cycloalkyl groups such as a cyclopentyl group and a cyclohexyl group;

monocyclic cycloalkenyl groups such as a cyclopentenyl group and a cyclohexenyl group;

polycyclic cycloalkyl groups such as a norbornyl group, an adamantyl group and a tricyclodecyl group;

polycyclic cycloalkenyl groups such as a norbornenyl group and a tricyclodecenyl group; and the like.

Examples of the aromatic hydrocarbon group having 6 to 20 carbon atoms which may be represented by R$^5$ include a phenyl group, a naphthyl group, an anthryl group, and the like.

Examples of the alicyclic structure having 3 to 20 carbon atoms which may be taken together represented by $R^6$ and $R^7$ together with the carbon atom to which $R^6$ and $R^7$ bond include:

monocyclic cycloalkane structures such as a cyclopropane structure, a cyclobutane structure, a cyclopentane structure, a cyclohexane structure, a cycloheptane structure and a cyclooctane structure;

polycyclic cycloalkane structures such as a norbornane structure, an adamantane structure, a tricyclodecane structure and a tetracyclododecane structure; and the like.

Preferred exemplary structural unit (IV-1) includes structural units represented by the following formulae (4-1) to (4-5) (hereinafter, may be also referred to as "structural units (IV-1-1) to (IV-1-5)").

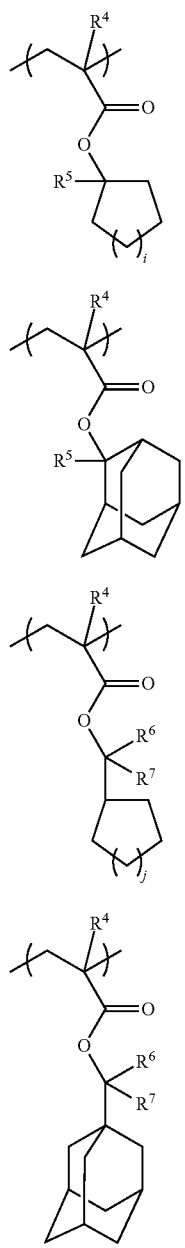

(4-1)

(4-2)

(4-3)

(4-4)

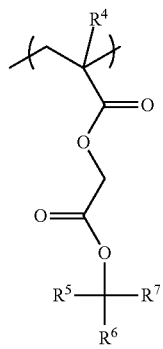

(4-5)

In the above formulae (4-1) to (4-5), $R^4$ to $R^7$ are as defined in the above formula (2); and i and j are each independently an integer of 1 to 4.

Examples of the structural units (IV-1-1) to (IV-1-5) include structural units represented by the following formulae, and the like.

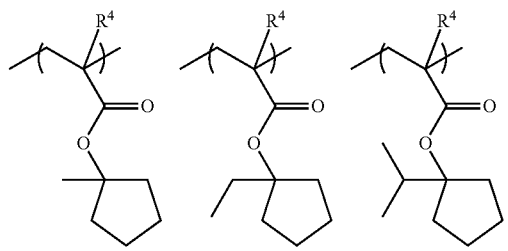

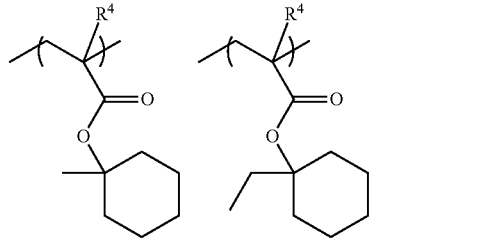

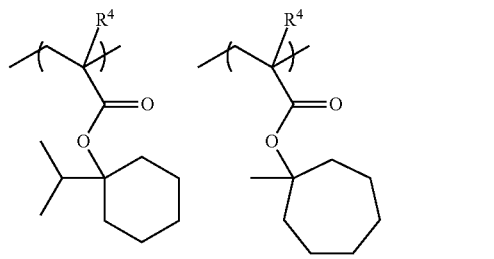

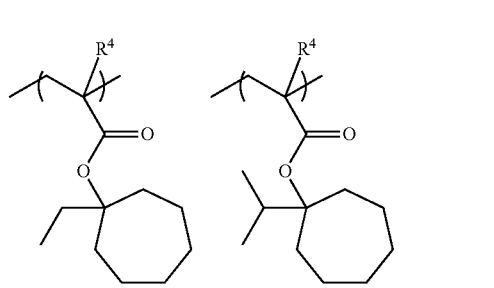

-continued
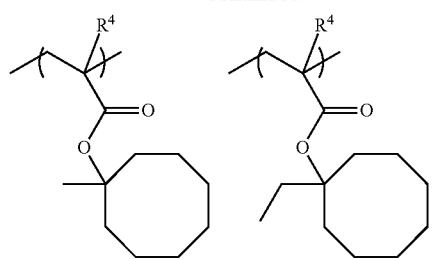
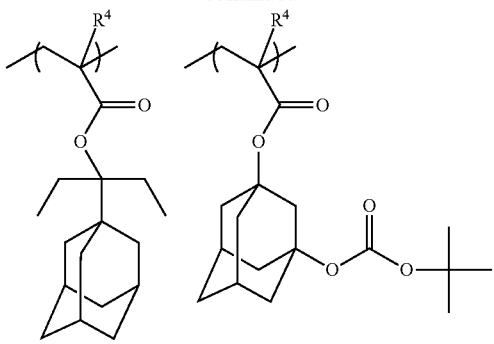
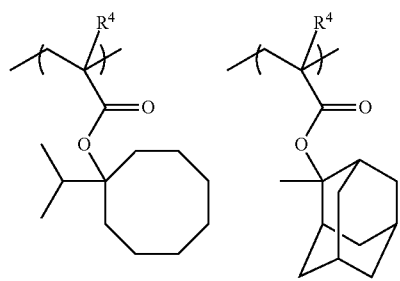
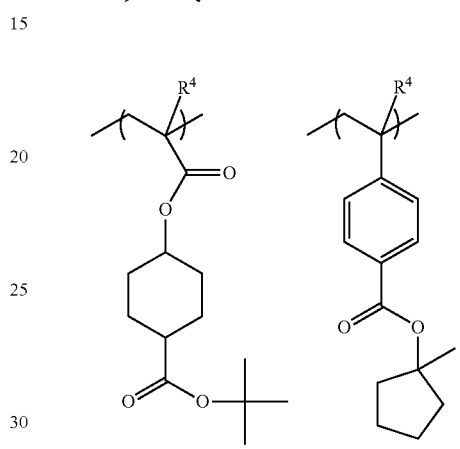
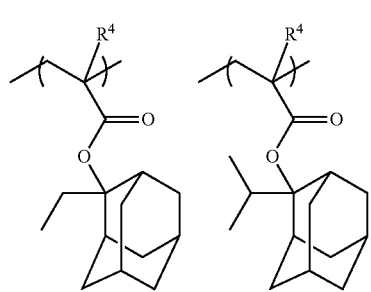
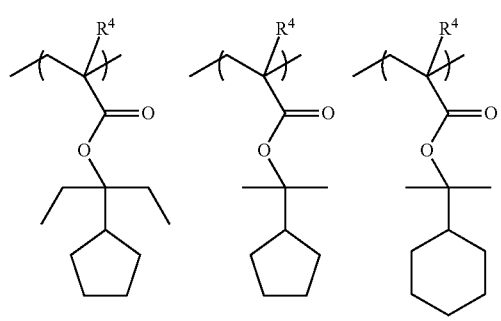
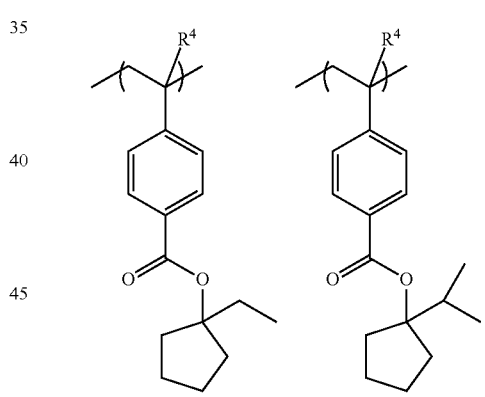
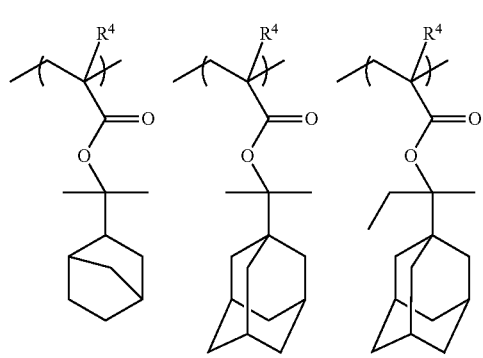
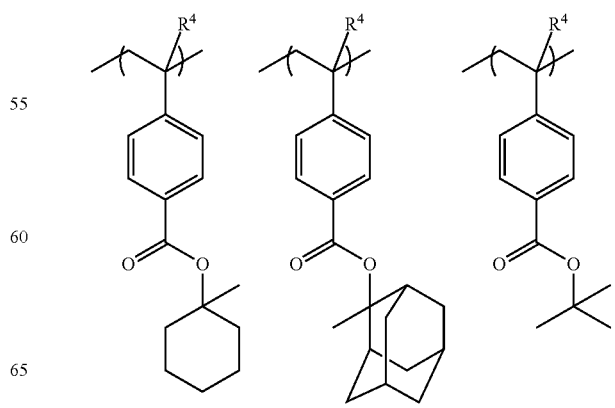

-continued

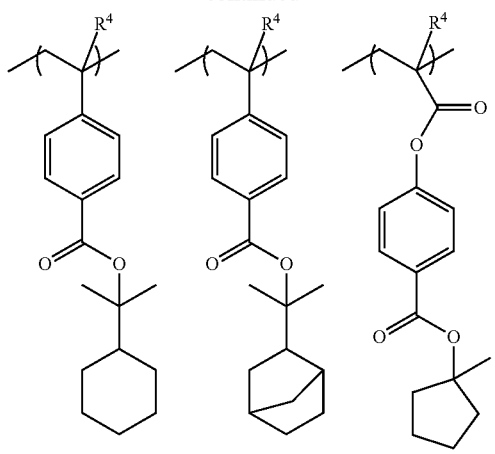

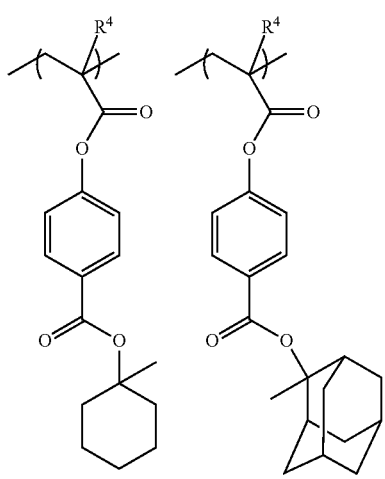

-continued

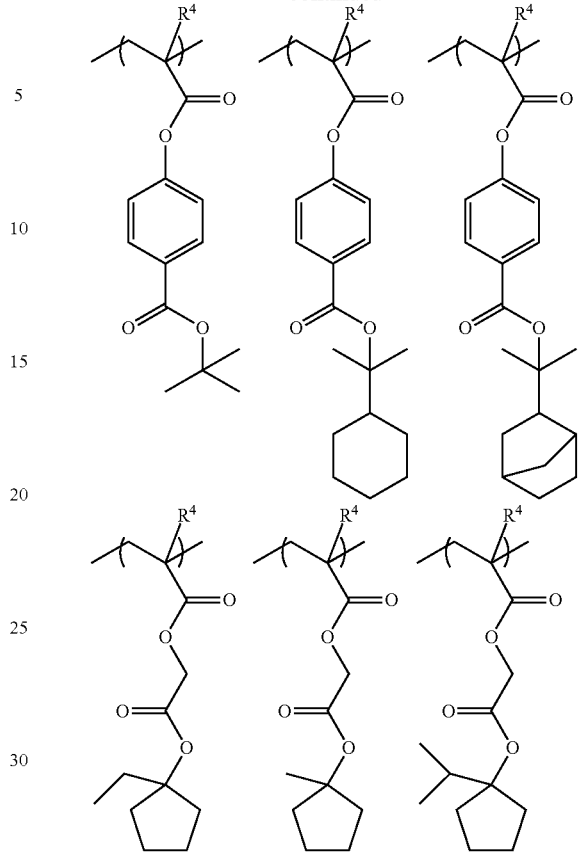

In the above formulae, $R^4$ is as defined in the above formula (4).

The structural unit (IV) is preferably a structural unit derived from 1-alkyl-monocyclic cycloalkan-1-yl (meth)acrylate, a structural unit derived from 2-alkyl-polycyclic cycloalkan-2-yl (meth)acrylate, a structural unit derived from 2-(cycloalkan-yl)propan-2-yl (meth)acrylate and a structural unit derived from 1-alkyl-monocyclic cycloalkan-1-yloxycarbonylmethyl (meth)acrylate, and more preferably a structural unit derived from 1-methylcyclopentan-1-yl (meth)acrylate, a structural unit derived from 1-i-propylcyclopentan-1-yl (meth)acrylate, a structural unit derived from 2-(adamantan-1-yl)propan-2-yl (meth)acrylate, a structural unit derived from 2-(cyclohexan-1-yl)propan-2-yl (meth)acrylate and a structural unit derived from 1-ethylcyclopentan-1-yloxycarbonylmethyl (meth)acrylate.

The lower limit of the proportion of the structural unit (IV) contained with respect to the total structural units constituting the polymer (B) is preferably 10 mol %, more preferably 20 mol %, still more preferably 30 mol %, and particularly preferably 35 mol %. The upper limit of the proportion is preferably 80 mol %, more preferably 75 mol %, still more preferably 70 mol %, and particularly preferably 60 mol %. When the proportion of the structural unit (IV) falls within the above range, more improvements of the lithography performances of the radiation-sensitive resin composition are enabled. In a case where the proportion is less than the lower limit, pattern formability of the radiation-sensitive resin composition may be deteriorated. In a case where the proportion is greater than the upper limit, adhesiveness of the resist pattern to the substrate may be deteriorated.

Structural Unit (V)

The structural unit (V) has at least one selected from the group consisting of a lactone structure, a cyclic carbonate structure and a sultone structure. Due to the polymer (B) further having the structural unit (V), a more appropriate adjustment of solubility in the developer solution is enabled, thereby consequently enabling the lithography performances of the radiation-sensitive resin composition to be improved. In addition, an improvement of the adhesiveness of the resist pattern formed from the radiation-sensitive resin composition to the substrate is enabled.

Examples of the structural unit (V) having a lactone structure include structural units represented by the following formulae (5-1-1) to (5-1-19) (hereinafter, may be also referred to as "structural units (V-1-1) to (V-1-19)"), and the like. Examples of the structural unit (V) having a cyclic carbonate structure include structural units represented by the following formulae (5-2-1) to (5-2-17) (hereinafter, may be also referred to as "structural units (V-2-1) to (V-2-17)"), and the like. Examples of the structural unit (V) having a sultone structure include structural units represented by the following formulae (5-3-1) to (5-3-11) (hereinafter, may be also referred to as "structural units (V-3-1) to (V-3-11)"), and the like.

(5-1-1)

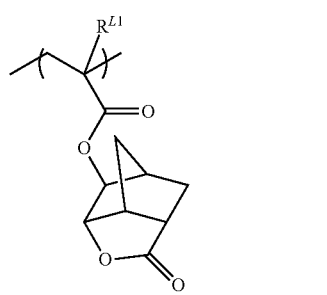

(5-1-2)

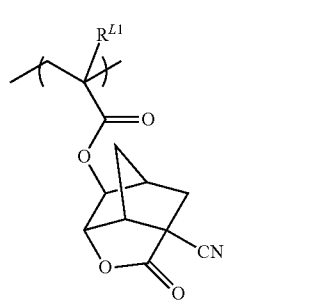

(5-1-3)

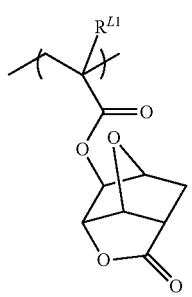

(5-1-4)

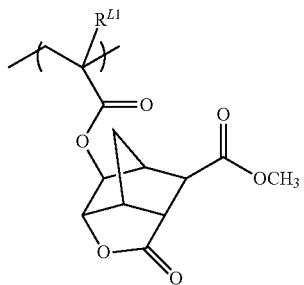

(5-1-5)

(5-1-6)

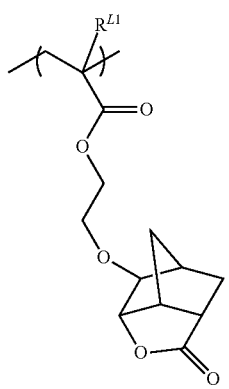

(5-1-7)

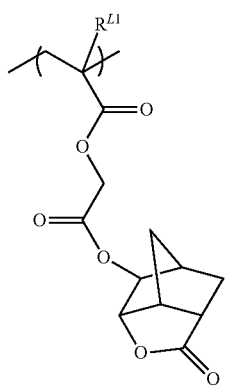

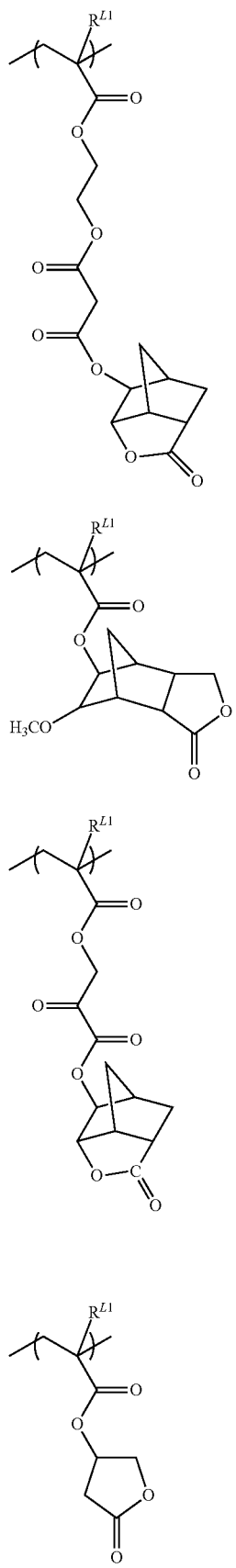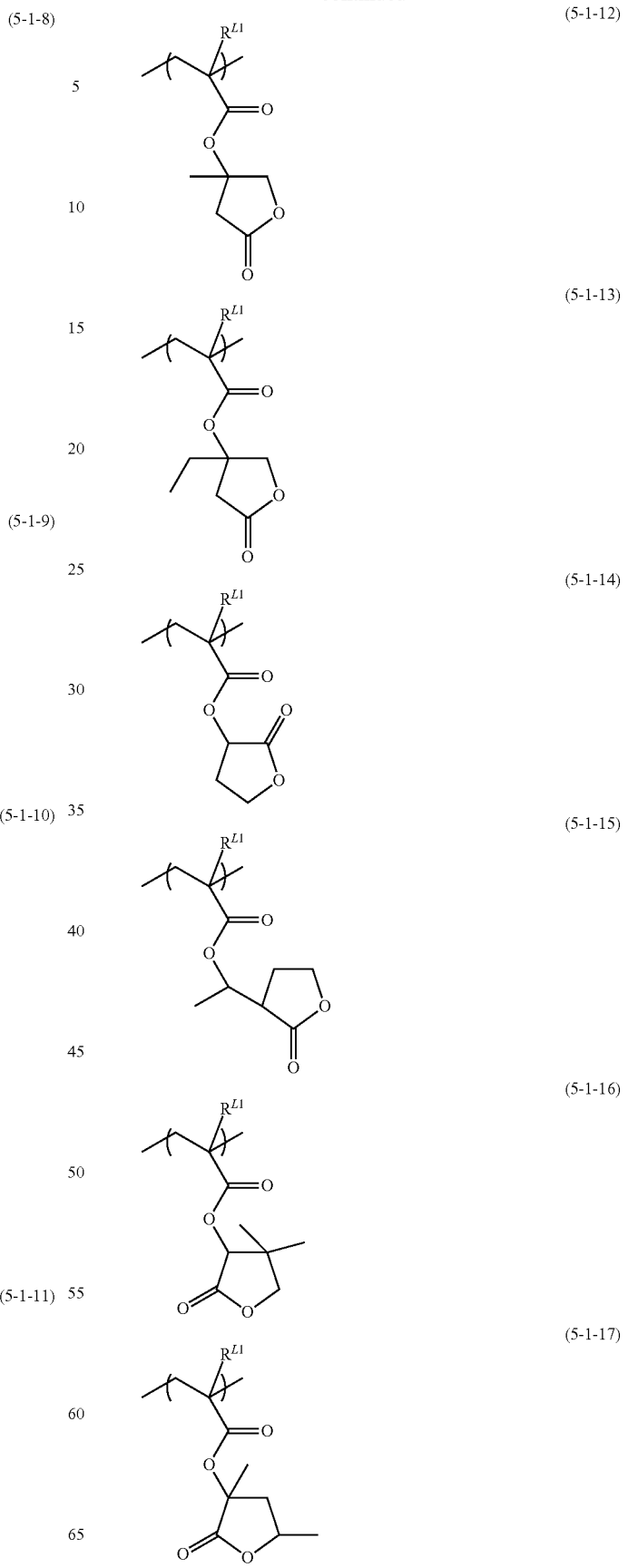

(5-1-18) 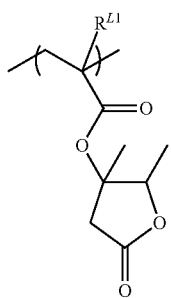
(5-1-19) 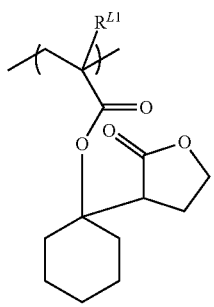
(5-2-1) 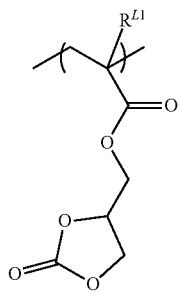
(5-2-2) 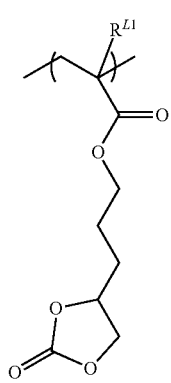
(5-2-3) 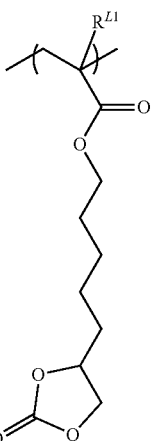
(5-2-4) 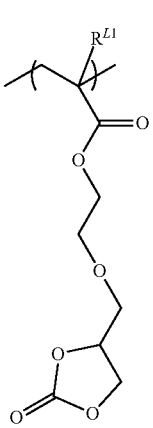
(5-2-5) 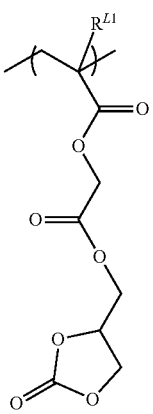
(5-2-6) 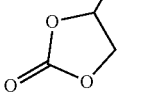

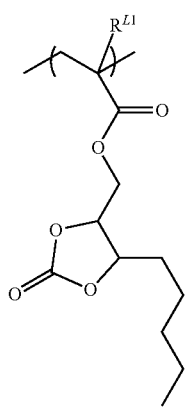
(5-2-7)
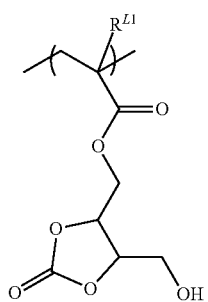
(5-2-8)
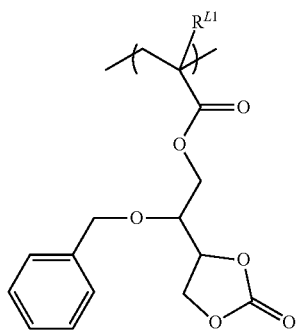
(5-2-9)
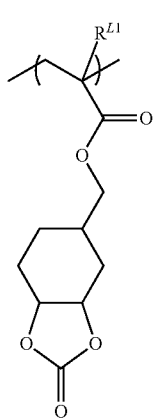
(5-2-10)
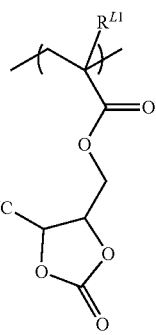
(5-2-11)
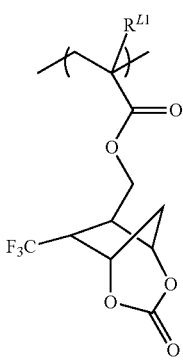
(5-2-12)
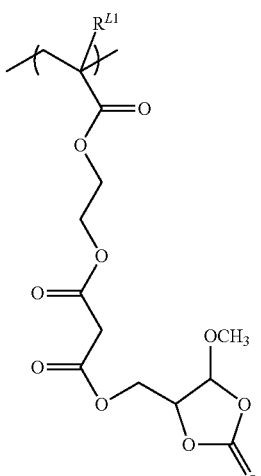
(5-2-13)
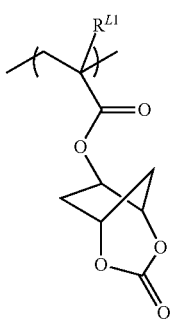
(5-2-14)

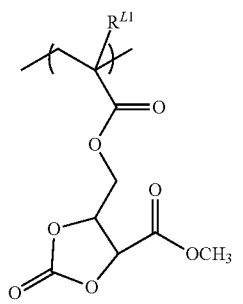
(5-2-15)
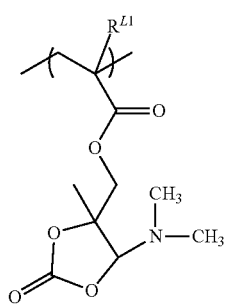
(5-2-16)
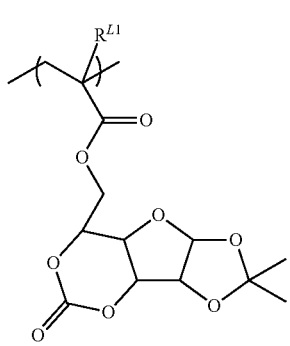
(5-2-17)
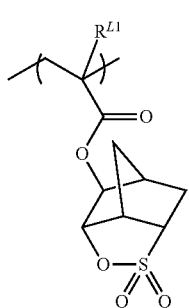
(5-3-1)
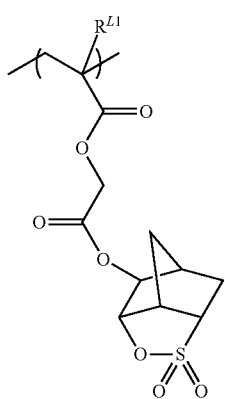
(5-3-2)
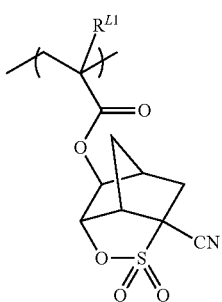
(5-3-3)
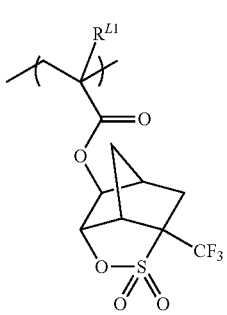
(5-3-4)
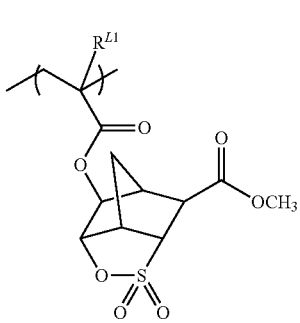
(5-3-5)
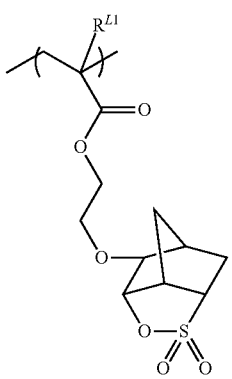
(5-3-6)
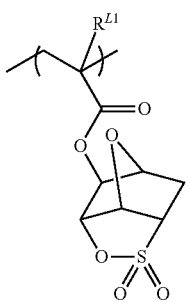
(5-3-7)

-continued

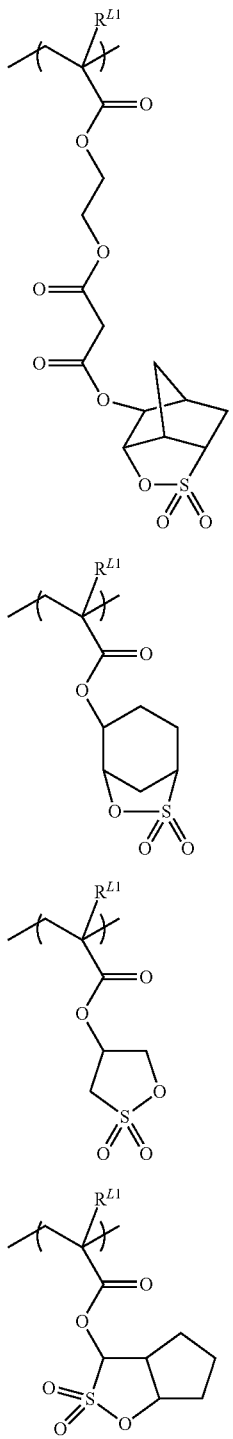

In the above formulae, $R^{L1}$ represents a hydrogen atom, a fluorine atom, a methyl group or a trifluoromethyl group.

The structural unit (V) is more preferably any of structural units (V-1-1), (V-1-2), (V-1-5), (V-1-7), (V-1-10), (V-1-13), (V-1-19), (V-2-1) and (V-3-1).

In the case where the polymer (B) has the structural unit (V), the lower limit of the proportion of the structural unit (V) contained with respect to the total structural units in the polymer (B) is preferably 10 mol %, and more preferably 20 mol %. The upper limit of the proportion is preferably 80 mol %, more preferably 70 mol %, and still more preferably 60 mol %. When the proportion of the structural unit (V) falls within the above range, more improvements of the lithography performances of the radiation-sensitive resin composition are enabled. In addition, a more improvement in the adhesiveness of the resultant resist pattern to the substrate is enabled.

The polymer (B) may have other structural unit in addition to the structural units (IV) and (V). Examples of the other structural unit include: a structural unit that includes at least one selected from the group consisting of a hydroxy group, a ketonic carbonyl group, a cyano group, a carboxy group, a nitro group and an amino group; a structural unit that includes an acid-nonlabile alicyclic hydrocarbon group such as a structural unit derived from tricyclodecyl (meth) acrylate; and the like. Of these, the structural unit that includes a hydroxy group is preferred, and a structural unit derived from 3-hydroxyadamantan-1-yl (meth)acrylate and a structural unit derived from 1-oxa-2-oxo-3-methylene-8-hydroxyspiro[4,5]decane are preferred. The proportion of these structural units contained is preferably no greater than 60 mol %, and more preferably no greater than 20 mol %.

The lower limit of the content of the polymer (B) with respect to 100 parts by mass of the compound (A) is preferably 1,500 parts by mass, more preferably 2,000 parts by mass, and still more preferably 2,500 parts by mass. The upper limit of the content of the polymer (B) with respect to 100 parts by mass of the compound (A) is preferably 9,000 parts by mass, more preferably 7,000 parts by mass, and still more preferably 4,000 parts by mass.

Furthermore, the lower limit of the content of the polymer (B) with respect to the total solid content of the radiation-sensitive resin composition is preferably 70% by mass, more preferably 80% by mass, and still more preferably 85% by mass.

Synthesis Process of Polymer (B)

The polymer (B) may be synthesized by, for example, polymerizing monomer(s) that give(s) each structural unit in an appropriate solvent using a radical polymerization initiator or the like.

Examples of the radical polymerization initiator include: azo-based radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide-based radical initiators such as benzoyl peroxide, t-butyl hydroperoxide and cumene hydroperoxide; and the like. Of these, AIBN and dimethyl 2,2'-azobisisobutyrate are preferred, and AIBN is more preferred. These radical initiators may be used either alone, or as a mixture of two or more types thereof.

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents for use in the polymerization may be used alone, or two or more types thereof may be used in combination.

The lower limit of the reaction temperature in the polymerization is preferably 40° C., and more preferably 50° C. The upper limit of the reaction temperature is preferably 150° C., and more preferably 120° C. The lower limit of the reaction time period in the polymerization is preferably 1 hr. The upper limit of the reaction time period is preferably 48 hrs, and more preferably 24 hrs.

The polystyrene equivalent weight average molecular weight (Mw) of the polymer (B) as determined by gel permeation chromatography (GPC) is not particularly limited, and the lower limit of Mw is preferably 1,000, more preferably 2,000, still more preferably 3,000, and particularly preferably 3,500. The upper limit of the Mw is preferably 50,000, more preferably 30,000, still more preferably 20,000, and particularly preferably 15,000. When the Mw of the polymer (B) falls within the above range, coating property and inhibitory ability of development defects of the radiation-sensitive resin composition are improved. In a case where the Mw of the polymer (B) is less than the lower limit, the resist film having sufficient heat resistance may not be obtained. In a case where the Mw of the polymer (B) is greater than the upper limit, developability of the resist film may be deteriorated.

The ratio (Mw/Mn) of the Mw to the polystyrene equivalent number average molecular weight (Mn) as determined by GPC of the polymer (B) is no less than 1 and no greater than 5, preferably no less than 1 and no greater than 3, and still more preferably no less than 1 and no greater than 2.

The Mw and the Mn of the polymer as referred to herein are values determined by using gel permeation chromatography (GPC) under the following conditions.

GPC columns: Tosoh Corporation, "G2000HXL"×2; "G3000HXL"×1; and "G4000HXL"×1
column temperature: 40° C.
elution solvent: tetrahydrofuran
flow rate: 1.0 mL/min
sample concentration: 1.0% by mass
amount of injected sample: 100 µL
detector: differential refractometer
standard substance: mono-dispersed polystyrene (C) Acid Generator The acid generator (C) contains an onium salt compound. The acid generator (C) is a substance that generates an acid upon an exposure. The acid thus generated allows the acid-labile group included in the polymer (B), the polymer (D) or the like to be dissociated, thereby generating a carboxy group or the like. As a result, the solubility of the polymer or the like in the developer solution is altered, and thus a resist pattern can be formed from the radiation-sensitive resin composition. The acid generator (C) may be contained in the radiation-sensitive resin composition either in the form of a low-molecular-weight compound (hereinafter, may be also referred to as "(C) acid generating agent" or "acid generating agent (C)", as appropriate), as described later, or in the form of an acid generator incorporated as a part of the polymer, or may be in both of these forms.

The acid generating agent (C) may contain in addition to the onium salt compound, an N-sulfonyloxyimide compound, a halogen-containing compound, a diazo ketone compound, etc., within a range not leading to impairment of the effects of the present invention.

The onium salt compound is exemplified by a sulfonium salt, a tetrahydrothiophenium salt, an iodonium salt, a phosphonium salt, a diazonium salt, a pyridinium salt, and the like.

Specific examples of the acid generating agent (C) include compounds disclosed in paragraphs [0080] to [0113] of Japanese Unexamined Patent Application, Publication No. 2009-134088, and the like.

The acid generator (C) is preferably a compound represented by the following formula (vi). When the acid generating agent (C) is the compound represented by the following formula (vi), it is expected that a diffusion length of the acid generated upon the exposure in the resist film will be more properly decreased through e.g. an interaction with a polar structure included in the polymer (B) or the polymer (D), or the like, and consequently more improvements of the lithography performances of the radiation-sensitive resin composition are enabled.

$$R^{b1}—R^{b2}—SO_3^-M^+ \tag{vi}$$

In the above formula (vi), $R^{b1}$ represents a monovalent group having an alicyclic structure, or a monovalent group having an aliphatic hetero ring structure; $R^{b2}$ represents a fluorinated alkanediyl group having 1 to 10 carbon atoms; and $M^+$ represents a monovalent radioactive ray-degradable onium cation.

In the monovalent group represented by $R^{b1}$, the number of ring atoms of the alicyclic structure or the aliphatic hetero ring structure is, for example, no less than 3 and no greater than 20. The number of "ring atoms" as referred to herein means the number of atoms constituting the alicyclic structure or the aliphatic hetero ring structure, and in the case of the polycyclic alicyclic structure and the polycyclic aliphatic hetero ring structure, the number of "ring atoms" may mean the number of atoms constituting the polycycle.

Examples of the monovalent group having an alicyclic structure which may be represented by $R^{b1}$ include:

monocyclic cycloalkyl groups such as a cyclopropyl group, a cyclobutyl group, a cyclopentyl group, a cyclohexyl group, a cyclooctyl group, a cyclononyl group, a cyclodecyl group and a cyclododecyl group;

monocyclic cycloalkenyl groups such as a cyclopropenyl group, a cyclobutenyl group, a cyclopentenyl group, a cyclohexenyl group, a cyclooctenyl group and a cyclodecenyl group;

polycyclic cycloalkyl groups such as a norbornyl group, an adamantyl group, a tricyclodecyl group and a tetracyclododecyl group;

polycyclic cycloalkenyl groups such as a norbornenyl group and a tricyclodecenyl group; and the like.

Examples of the monovalent group having an aliphatic hetero ring structure which may be represented by $R^{b1}$ include:

groups having a lactone structure such as a butyrolactone-yl group and a norbornanelactone-yl group;

groups having a sultone structure such as a norbornanesultone-yl group;

oxygen atom-containing heterocyclic groups such as an oxacyclopropyl group, an oxacyclobutyl group, an oxacyclopentyl group, an oxacyclohexyl group, an oxacycloheptyl group and an oxanorbornyl group;

nitrogen atom-containing heterocyclic groups such as an azacyclopropyl group, an azacyclobutyl group, an azacyclopentyl group, an azacyclohexyl group, an azacycloheptyl group and a diazabicyclooctan-yl group;

sulfur atom-containing heterocyclic groups such as a thiacyclopropyl group, a thiacyclobutyl group, a thiacyclopentyl group, a thiacyclohexyl group, a thiacycloheptyl group and a thianorbornyl group; and the like.

The number of ring atoms of the alicyclic structure or the aliphatic hetero ring structure in the group represented by $R^{b1}$ is, in light of further optimization of the diffusion length of the acid, preferably no less than 6, more preferably no less than 8, still more preferably 9 to 15, and particularly preferably 10 to 13.

Of these, $R^{b1}$ represents preferably the monovalent group having an alicyclic structure having at least 9 ring atoms or the monovalent group having an aliphatic hetero ring structure having at least 9 ring atoms, more preferably an adamantyl group, a hydroxyadamantyl group, a norbomanelactone-yl group or a 5-oxo-4-oxatricyclo[4.3.1.1$^{3,8}$]undecan-yl group, and still more preferably an adamantyl group.

Examples of the fluorinated alkanediyl group having 1 to 10 carbon atoms which may be represented by $R^{b2}$ include groups obtained by substituting with a fluorine atom, one or more hydrogen atoms included in alkanediyl groups having 1 to 10 carbon atoms, such as a methanediyl group, an ethanediyl group and a propanediyl group, and the like.

Of these, a fluorinated alkanediyl group in which at least one fluorine atom bonds to the carbon atom adjacent to the $SO_3^-$ group is preferred, a fluorinated alkanediyl group in which two fluorine atoms bond to the carbon atom adjacent to the $SO_3^-$ group is more preferred, and a 1,1-difluoromethanediyl group, a 1,1-difluoroethanediyl group, a 1,1,3,3,3-pentafluoro-1,2-propanediyl group, a 1,1,2,2-tetrafluoroethanediyl group, a 1,1,2,2-tetrafluorobutanediyl group and a 1,1,2,2-tetrafluorohexanediyl group are still more preferred.

The monovalent radioactive ray-degradable onium cation represented by $M^+$ may be similarly defined to the radiation-sensitive onium cation exemplified as $Y^+$ in the formula (1) for the compound (A), and the like.

Examples of the acid generating agent (C) include compounds represented by the following formulae (vi-1) to (vi-17) (hereinafter, may be also referred to as "compounds (vi-1) to (vi-17)"), and the like.

(vi-1)

(vi-2)

(vi-3)

(vi-4)

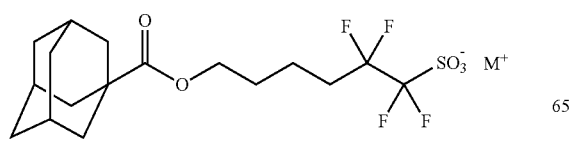

(vi-5)

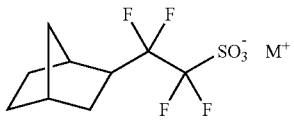

(vi-6)

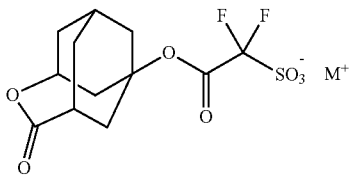

(vi-7)

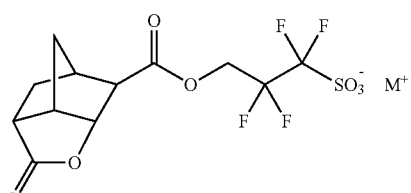

(vi-8)

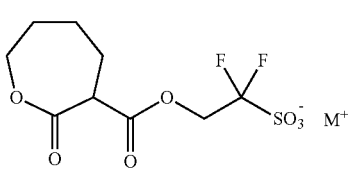

(vi-9)

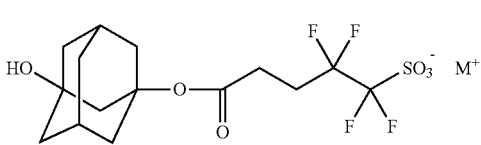

(vi-10)

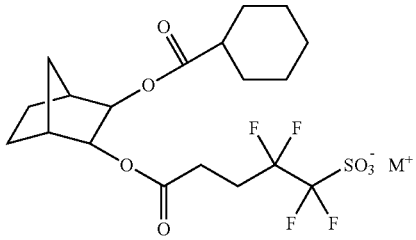

(vi-11)

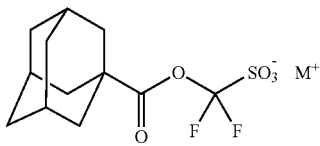

(vi-12)

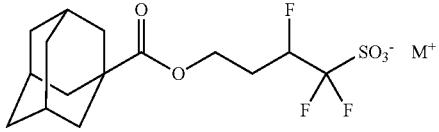

(vi-13)

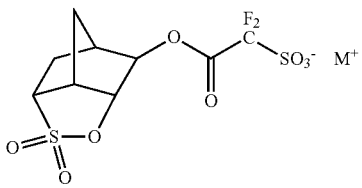

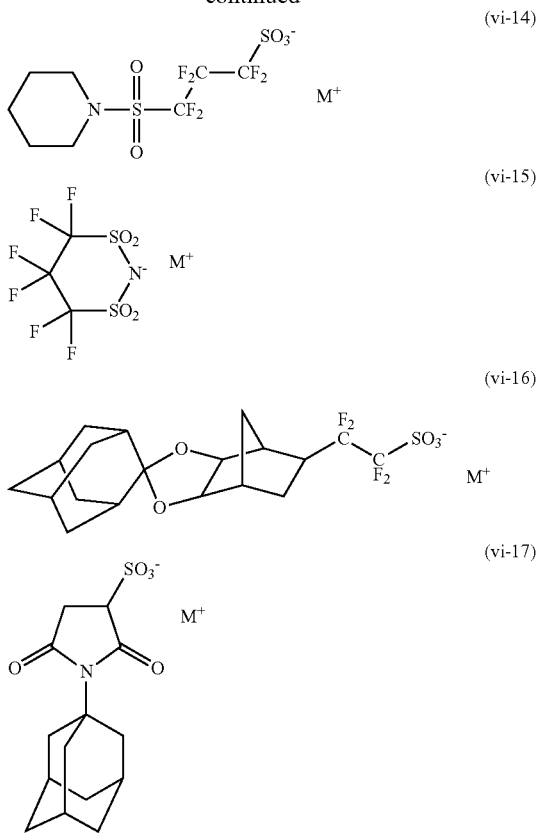

Of these, the acid generating agent (C) is preferably the sulfonium salt, and more preferably the compounds (vi-1) to (vi-3) and the compounds (vi-13) to (vi-17).

In the case where the acid generator (C) is the acid generating agent (C), the lower limit of the content the acid generating agent (C) with respect to 100 parts by mass of the compound (A) is, in light of improvements of the sensitivity and the developability of the radiation-sensitive resin composition, preferably 10 parts by mass, more preferably 30 parts he by mass, and still more preferably 50 parts by mass. The upper limit of the content is preferably 1,000 parts by mass, more preferably 800 parts by mass, and still more preferably 500 parts by mass.

Furthermore, the lower limit of the content of the acid generating agent (C) with respect to 100 parts by mass of the polymer (B) is preferably 0.1 parts by mass, more preferably 0.5 parts by mass, still more preferably 1 part by mass, and particularly preferably 3 parts by mass. The upper limit of the content is preferably 30 parts by mass, more preferably 20 parts by mass, and still more preferably 15 parts by mass. One, or two or more types of the acid generator (C) may be used.

(D) Polymer

The polymer (D) has the total percentage content by mass of fluorine atoms and silicon atoms greater than the polymer (B). The polymer (D) preferably includes at least any of a structural unit (I), a structural unit (II) and a structural unit (III) described below. When the radiation-sensitive resin composition contains the polymer (D), in forming the resist film, the polymer (D) tends to be localized in the surface layer of the resist film due to oil-repellent characteristics of the polymer (D), thereby enabling the acid generating agent, the acid diffusion control agent and the like used in liquid immersion lithography to be prevented from elution into the liquid immersion liquid. Moreover, due to the water-repellent characteristic of the polymer (D), an advancing contact angle of a liquid immersion liquid on the resist film can be controlled to fall within a desired range, thereby enabling generation of bubble defects to be inhibited. Furthermore, a greater receding contact angle of the liquid immersion liquid on the resist film is attained, whereby an exposure by high-speed scanning without being accompanied by residual water beads is enabled. In addition, also in the cases of electron beam exposure and EUV exposure, the inhibitory ability of defects of the resist film can be improved by way of the water-repellent characteristic of the polymer (D). Thus, when the radiation-sensitive resin composition contains the polymer (D), forming a resist film suited for liquid immersion lithography, electron beam exposure, EUV exposure and the like is enabled.

The lower limit of the total percentage content by mass of fluorine atoms and silicon atoms of the polymer (D) is preferably 1% by mass, more preferably 2% by mass, still more preferably 4% by mass, and particularly preferably 7% by mass. The upper limit of the total percentage content by mass is preferably 60% by mass, more preferably 40% by mass, and still more preferably 30% by mass. The total percentage content by mass of fluorine atoms and silicon atoms of the polymer may be obtained by determining the structure of the polymer by $^{13}$C-NMR spectroscopy or the like, and calculation from the structure.

The polymer (D) preferably includes an alkali-labile group. Due to the polymer (D) having the alkali-labile group, the hydrophobic surface of the resist film can be effectively rendered hydrophilic in a development with an alkali, whereby the inhibitory ability of development defects of the radiation-sensitive resin composition is improved. When the polymer (D) includes the alkali-labile group, ion exchange, etc., with a conventionally used onium salt compound is likely to occur, leading to a more deterioration of the storage stability and the inhibitory ability of development defects of the radiation-sensitive resin composition. However, since the specific compound (A) is used as the onium salt compound in the radiation-sensitive resin composition, the storage stability and the inhibitory ability of development defects become superior even in the case where the polymer (D) includes the alkali-labile group. The "alkali-labile group" as referred to herein means a group that substitutes for a hydrogen atom of a carboxy group, a hydroxy group or the like, and that dissociates in an alkali aqueous solution (for example, a 2.38% by mass aqueous tetramethylammonium hydroxide solution at 23° C.).

The mode of incorporation of the fluorine atom in the polymer (D) is not particularly limited, and the fluorine atom may bond to any of the main chain, a side chain and an end of the polymer (D); however, the polymer (D) preferably has a structural unit (hereinafter, may be also referred to as "structural unit (I)") that includes a fluorine atom (I). It is preferred that the polymer (D) has in addition to at least any of the structural unit (I), the structural unit (II) and the structural unit (III), a structural unit that includes an acid-labile group (the same as the structural unit (IV) in the polymer (B)), in light of an improvement of the inhibitory ability of development defects of the radiation-sensitive resin composition.

Structural Unit (I)

The structural unit (I) is represented by the following formula (2). Since the polymer (D) has the structural unit (I), the percentage content of the fluorine atom can be adjusted.

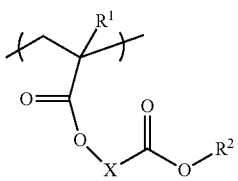

(2)

In the above formula (2), $R^1$ represents a hydrogen atom, an alkyl group having 1 to 10 carbon atoms or an alkoxyalkyl group having 2 to 10 carbon atoms; X represents a divalent organic group having 1 to 20 carbon atoms; and $R^2$ represents a monovalent hydrocarbon group having 1 to 20 carbon atoms or a monovalent fluorinated hydrocarbon group having 1 to 20 carbon atoms, wherein at least one of X and $R^2$ represents a group that includes a fluorine atom.

$R^1$ represents preferably a hydrogen atom, an alkyl group having 1 to 10 carbon atoms or an alkoxy group having 1 to 10 carbon atoms, and more preferably a methyl group, an ethyl group, a methoxy group or an ethoxy group.

Exemplary monovalent hydrocarbon groups having 1 to 20 carbon atoms which may be represented by $R^2$ include a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include:

alkyl groups such as a methyl group, an ethyl group, a n-propyl group and an i-propyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms include:

monocyclic cycloalkyl groups such as a cyclopentyl group and a cyclohexyl group;

monocyclic cycloalkenyl groups such as a cyclopentenyl group and a cyclohexenyl group;

polycyclic cycloalkyl groups such as a norbornyl group, an adamantyl group and a tricyclodecyl group;

polycyclic cycloalkenyl groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a naphthyl group and an anthryl group;

aralkyl groups such as a benzyl group, a phenethyl group, a naphthylmethyl group and an anthrylmethyl group; and the like.

The monovalent hydrocarbon group is preferably the chain hydrocarbon group and the alicyclic hydrocarbon group.

Exemplary monovalent fluorinated hydrocarbon groups having 1 to 20 carbon atoms which may be represented by $R^2$ include a fluorinated alkyl group having 1 to 20 carbon atoms, and the like. The monovalent fluorinated hydrocarbon group having 1 to 20 carbon atoms which may be represented by $R^2$ is preferably a fluorine atom and fluorinated alkyl group, more preferably a fluorine atom and a perfluoroalkyl group, and still more preferably a fluorine atom and a trifluoromethyl group.

Furthermore, in light of more improvements in benefits as the alkali-labile group, it is preferred that at least one of X and $R^2$ represents a group that includes a fluorine atom.

In the case where the polymer (D) has the structural unit (I), the lower limit of the proportion of the structural unit (I) contained with respect to the total structural units constituting the polymer (D) is preferably 5 mol %, more preferably 30 mol %, and still more preferably 50 mol %. The upper limit of the proportion is preferably 100 mol %, more preferably 95 mol %, and still more preferably 90 mol %. The proportion of the structural unit (I) falling within the above range enables the percentage content of the fluorine atom in the polymer (D) to be more appropriately adjusted.

Structural Unit (II)

The structural unit (II) is represented by the following formula (3). Since the polymer (D) has the structural unit (II), the percentage content of the fluorine atom can be adjusted.

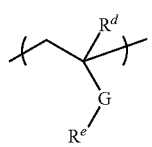

(3)

In the above formula (3), $R^d$ represents a hydrogen atom, a methyl group or a trifluoromethyl group; G represents a single bond, an oxygen atom, a sulfur atom, —CO—O—, —SO$_2$—NH—, —CO—NH— or —O—CO—NH—; and $R^e$ represents a monovalent fluorinated chain hydrocarbon group having 1 to 6 carbon atoms, or a monovalent fluorinated alicyclic hydrocarbon group having 4 to 20 carbon atoms.

$R^d$ represents, in light of a degree of copolymerization, etc., of a monomer that gives a structural unit (Ia), preferably a hydrogen atom or a methyl group, and more preferably a methyl group.

G represents preferably —CO—O—, —SO$_2$—NH—, —CO—NH— or —O—CO—NH—, and more preferably —CO—O—.

Examples of the monovalent fluorinated chain hydrocarbon group having 1 to 6 carbon atoms which may be represented by $R^e$ include a trifluoromethyl group, a 2,2,2-trifluoroethyl group, a perfluoroethyl group, a 2,2,3,3,3-pentafluoropropyl group, a 1,1,1,3,3,3-hexafluoropropyl group, a perfluoro-n-propyl group, a perfluoro-i-propyl group, a perfluoro-n-butyl group, a perfluoro-i-butyl group, a perfluoro-t-butyl group, a 2,2,3,3,4,4,5,5-octafluoropentyl group, a perfluorohexyl group, and the like.

Examples of the monovalent fluorinated alicyclic hydrocarbon group having 4 to 20 carbon atoms which may be represented by $R^e$ include a monofluorocyclopentyl group, a difluorocyclopentyl group, a perfluorocyclopentyl group, a monofluorocyclohexyl group, a difluorocyclopentyl group, a perfluorocyclohexylmethyl group, a fluoronorbornyl group, a fluoroadamantyl group, a fluorobornyl group, a fluoroisobornyl group, a fluorotricyclodecyl group, a fluorotetracyclodecyl group, and the like.

Of these, $R^e$ represents preferably the fluorinated chain hydrocarbon group, and more preferably a 2,2,2-trifluoroethyl group or a 1,1,1,3,3,3-hexafluoro-2-propyl group.

In the case where the polymer (D) has the structural unit (II), the lower limit of the proportion of the structural unit (II) contained with respect to the total structural units constituting the polymer (D) is preferably 3 mol %, and more preferably 5 mol %. The upper limit of the proportion is preferably 90 mol %, more preferably 70 mol %, and still more preferably 50 mol %. The proportion of the structural unit (II) falling within the above range enables the percentage content of the fluorine atom of the polymer (D) to be more appropriately adjusted.

Structural Unit (III)

The structural unit (III) includes a silicon atom.

The structural unit (III) is exemplified by a structural unit (hereinafter, may be also referred to as "structural unit (III-1)") that includes a group represented by the following formula (a), and the like.

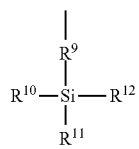

(a)

In the above formula (a), $R^9$ represents a single bond or a divalent hydrocarbon group having 1 to 10 carbon atoms; and $R^{10}$, $R^{11}$ and $R^{12}$ each independently represent a hydrogen atom, a monovalent hydrocarbon group having 1 to 10 carbon atoms, $-SiR'_3$, $-Si_2R'_5$ or $-OSiR'_3$, or $R^{10}$, $R^{11}$ and $R^{12}$ taken together represent a ring structure having 3 to 10 ring atoms together with the silicon atom to which $R^{10}$, $R^{11}$ and $R^{12}$ bond, where R' each independently represent represents a hydrogen atom or a monovalent hydrocarbon group having 1 to 10 carbon atoms, wherein at least any of $R^{10}$, $R^{11}$ and $R^{12}$ represents $-SiR'_3$, $-Si_2R'_5$ or $-OSiR'_3$.

The structural unit (III) is exemplified by a structural unit (hereinafter, may be also referred to as "structural unit (III-2)") represented by the following formula (a-1).

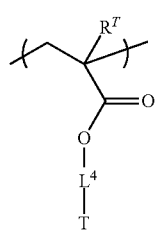

(a-1)

In the above formula (a-1), $R^T$ represents a hydrogen atom, a fluorine atom, a methyl group or a trifluoromethyl group; $L^4$ represents a single bond or a divalent organic group having 1 to 20 carbon atoms; and T represents a group represented by the above formula (a).

$R^T$ represents, in light of a degree of copolymerization of the monomer that gives a structural unit (III), preferably a hydrogen atom or a methyl group, and more preferably a methyl group.

$L^4$ preferably represents a single bond.

The structural unit (III) is preferably a structural unit derived from trimethylsilyl (meth)acrylate.

In the case where the polymer (D) has the structural unit (III), the lower limit of the proportion of the structural unit (III) contained with respect to the total structural units constituting the polymer (D) is preferably 5 mol %, more preferably 30 mol %, and still more preferably 50 mol %.

The upper limit of the proportion is preferably 100 mol %, more preferably 95 mol %, and still more preferably 90 mol %. The proportion falling within the above range, enables the percentage content of the silicon atom of the polymer (D) to be more appropriately adjusted.

In the case where the polymer (D) has a structural unit that includes an acid-labile group (the same as the structural unit (IV) in the polymer (B)), the lower limit of the proportion of this structural unit contained with respect to the total structural units constituting the polymer (D) is preferably 5 mol %, more preferably 7 mol %, and still more preferably 10 mol %. The upper limit of the proportion is preferably 60 mol %, more preferably 50 mol %, and still more preferably 40 mol %. The proportion of the structural unit that includes an acid-labile group in the polymer (D) falling within the above range enables the inhibitory ability of development defects of the radiation-sensitive resin composition to be more improved.

The lower limit of the content of the polymer (D) with respect to 100 parts by mass of the compound (A), is preferably 5 parts by mass, more preferably 30 parts by mass, and still more preferably 60 parts by mass. The upper limit of the content of the polymer (D) with respect to 100 parts by mass of the compound (A) is preferably 300 parts by mass, more preferably 250 parts by mass, and still more preferably 150 parts by mass. When the content of the polymer (D) falls within the above range, improvements of the storage stability and the inhibitory ability of development defects of the radiation-sensitive resin composition are enabled.

The lower limit of the content of the polymer (D) with respect to 100 parts by mass of the polymer (B) is preferably 0.1 parts by mass, more preferably 0.2 parts by mass, still more preferably 0.5 parts by mass, and particularly preferably 1 part by mass. The upper limit of the content of the polymer (D) with respect to 100 parts by mass of the polymer (B) is preferably 30 parts by mass, more preferably 20 parts by mass, still more preferably 15 parts by mass, and particularly preferably 10 parts by mass.

The polymer (D) may be synthesized by a process similar to that for the polymer (B).

The polystyrene equivalent weight average molecular weight (Mw) of the polymer (D) as determined by gel permeation chromatography (GPC) is not particularly limited, and is preferably no less than 1,000 and no greater than 50,000, more preferably no less than 2,000 and no greater than 30,000, still more preferably no less than 2,500 and no greater than 20,000, and particularly preferably no less than 3,000 and no greater than 15,000. When the Mw of the polymer (D) falls within the above range, the coating property and the inhibitory ability of development defects may be improved. In a case where the Mw of the polymer (D) is less than the lower limit, the resist film having sufficient heat resistance may not be obtained. In a case where the Mw of the polymer (D) is greater than the upper limit, the developability of the resist film may be deteriorated.

The ratio (Mw/Mn) of the Mw to the polystyrene equivalent number average molecular weight (Mn) as determined by GPC of the polymer (D) is typically no less than 1 and no greater than 5, preferably no less than 1 and no greater than 3, and still more preferably no less than 1 and no greater than 2.

(E) Solvent

The radiation-sensitive resin composition of the embodiment typically contains (E) a solvent. The solvent (E) is not particularly limited as long as the solvent (E) can dissolve or disperse at least the compound (A), the polymer (B), the acid generator (C), as well as the polymer (D) contained as needed, etc.

The solvent (E) is exemplified by an alcohol solvent, an ether solvent, a ketone solvent, an amide solvent, an ester solvent, a hydrocarbon solvent, and the like.

Examples of the alcohol solvent include:

$C_{1-18}$ aliphatic monohydric alcohol solvents such as 4-methyl-2-pentanol and n-hexanol;

$C_{3-18}$ alicyclic monohydric alcohol solvents such as cyclohexanol;

$C_{2-18}$ polyhydric alcohol solvents such as 1,2-propylene glycol;

$C_{3-19}$ polyhydric alcohol partial ether solvents such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole (methyl phenyl ether); and the like.

Examples of the ketone solvent include:

chain ketone solvents such as acetone, methyl ethyl ketone, methyl-n-propyl ketone, methyl n-butyl ketone, diethyl ketone, methyl iso-butyl ketone, 2-heptanone (methyl n-pentylketone), ethyl n-butyl ketone, methyl-n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as n-butyl acetate and ethyl lactate;

polyhydric alcohol carboxylate solvents such as propylene glycol acetate;

polyhydric alcohol partial ether carboxylate solvents such as propylene glycol monomethyl ether acetate;

lactone solvents such as γ-butyrolactone and δ-valerolactone;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

$C_{5-12}$ aliphatic hydrocarbon solvents such as n-pentane and n-hexane;

$C_{6-16}$ aromatic hydrocarbon solvents such as toluene and xylene; and the like.

Of these, as the solvent (E), the ester solvent and the ketone solvent are preferred, the polyhydric alcohol partial ether carboxylate solvent, the lactone solvent and the cyclic ketone solvent are more preferred, polyhydric alcohol partial alkyl ether acetate, the lactone solvent and cycloalkanones are still more preferred, and propylene glycol monomethyl ether acetate, γ-butyrolactone and cyclohexanone are particularly preferred. The radiation-sensitive resin composition may contain one type, or two or more types of the solvent (E).

Other Optional Component

The radiation-sensitive resin composition of the embodiment may contain other optional component except for the components (A) to (E). The other optional component is exemplified by other acid diffusion controller except for the compound (A), a surfactant, an alicyclic skeleton-containing compound, a sensitizing agent, and the like. Each of these other optional components may be used either alone, or two or more types thereof may be used in combination.

Other Acid Diffusion Controller

The radiation-sensitive resin composition may contain other acid diffusion controller except for the compound (A), within a range not leading to impairment of the effects of the present invention.

The other acid diffusion controller controls a phenomenon of diffusion of the acid, which was generated from the acid generator (C) upon the exposure, in the resist film. As a result, the effect of inhibiting unwanted chemical reactions in an unexposed region is exhibited. In addition, the storage stability of the resultant radiation-sensitive resin composition is further improved. Moreover, resolution for use as a resist is further improved, and variation of the line width of the resist pattern caused by variation of post-exposure time delay from the exposure until a development treatment can be suppressed, which enables the radiation-sensitive resin composition with superior process stability to be obtained. The other acid diffusion controller may be contained in the radiation-sensitive resin composition in a free compound form (hereinafter, referred to as "other acid diffusion control agent" as appropriate), in the form incorporated as a part of the polymer, or may be in both of these forms.

The other acid diffusion control agent is exemplified by a compound represented by the following formula (vii) (hereinafter, may be also referred to as "nitrogen-containing compound (I)"), a compound having two nitrogen atoms in the same molecule (hereinafter, may be also referred to as "nitrogen-containing compound (III)"), a compound having three nitrogen atoms (hereinafter, may be also referred to as "nitrogen-containing compound (IV)"), an amide group-containing compound, a urea compound, a nitrogen-containing heterocyclic compound, and the like.

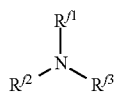

(vii)

In the above formula (vii), $R^{f1}$, $R^{f2}$ and $R^{f3}$ each independently represent a hydrogen atom, an unsubstituted or substituted linear, branched or cyclic alkyl group, an unsubstituted or substituted aryl group or an unsubstituted or substituted aralkyl group.

Examples of the nitrogen-containing compound (I) include: monoalkylamines such as n-hexylamine; dialkylamines such as di-n-butylamine; trialkylamines such as triethylamine and tri-n-pentylamine; aromatic amines such as aniline; and the like.

Examples of the nitrogen-containing compound (III) include ethylenediamine, N,N,N',N'-tetramethylethylenediamine, and the like.

Examples of the nitrogen-containing compound (IV) include: polyamine compounds such as polyethylene imine and polyallylamine; polymers of dimethylaminoethylacrylamide, etc., and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include: pyridines such as pyridine and 2-methylpyridine; morpholines such as N-propylmorpholine and N-(undecan-1-ylcarbonyloxyethyl)morpholine; pyrazine; pyrazole; and the like.

Also, as the nitrogen-containing organic compound, a compound having an acid-labile group may be used. Examples of the nitrogen-containing heterocyclic compound having an acid-labile group include N-t-butoxycarbonylpiperidine, N-t-butoxycarbonylimidazole, N-t-butoxycarbonylbenzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, and the like.

In addition, a photodegradable base which is sensitized upon an exposure to generate a weak acid can be also used as the other acid diffusion controller. The photodegradable base is exemplified by an onium salt compound and the like that lose acid diffusion controllability through degradation upon an exposure (except for those corresponding to the compound (A)).

In the case where the radiation-sensitive resin composition contains the other acid diffusion control agent, the lower limit of the content of the other acid diffusion control agent with respect to 100 parts by mass of the polymer (B) is preferably 0.1 parts by mass, more preferably 0.3 parts by mass, and still more preferably 0.5 parts by mass. The upper limit of the content is preferably 20 parts by mass, more preferably 15 parts by mass, still more preferably 10 parts by mass, and particularly preferably 5 parts by mass. When the content of the other acid diffusion controller is greater than the upper limit, the sensitivity of the radiation-sensitive resin composition may be deteriorated.

Surfactant

The surfactant exerts the effect of improving the coating property, striation, developability, and the like. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate; and the like, as well as commercially available products such as: "KP341" available from Shin-Etsu Chemical Co., Ltd.; "Polyflow No. 75" and "Polyflow No. 95" available from Kyoeisha Chemical Co., Ltd.; "EFTOP EF301", "EFTOP EF303" and "EFTOP EF352" available from Tochem Products Co. Ltd.; "Megaface F171" and "Megaface F173" available from DIC Corporation; "Fluorad FC430" and "Fluorad FC431" available from Sumitomo 3M Limited; "ASAHI GUARD AG710", "Surflon S-382", "Surflon SC-101", "Surflon SC-102", "Surflon SC-103", "Surflon SC-104", "Surflon SC-105" and "Surflon SC-106" available from Asahi Glass Co., Ltd.; and the like. The content of the surfactant in the radiation-sensitive resin composition of the embodiment with respect to 100 parts by mass of the polymer (B) is typically no greater than 2 parts by mass.

Alicyclic Skeleton-Containing Compound

The alicyclic skeleton-containing compound exerts the effect of improving dry etching resistance, pattern configuration, adhesiveness to the substrate, and the like.

Sensitizing Agent

The sensitizing agent exhibits an action of increasing the amount of acid production from the acid generator (C), etc., and exerts the effect of improving "apparent sensitivity" of the radiation-sensitive resin composition.

Examples of the sensitizing agent include carbazoles, acetophenones, benzophenones, naphthalenes, phenols, biacetyl, eosin, rose bengal, pyrenes, anthracenes, phenothiazines, and the like. These sensitizing agents may be used either alone, or two or more types thereof may be used in combination. The content of the sensitizing agent in the radiation-sensitive resin composition with respect to 100 parts by mass of the polymer (B) is typically no greater than 2 parts by mass.

Preparation Method of Radiation-Sensitive Resin Composition

The radiation-sensitive resin composition of the embodiment may be prepared by, for example, mixing the compound (A), the polymer (B), the acid generator (C), the polymer (D), the solvent (E) and the like in a certain ratio. After the mixing, the radiation-sensitive resin composition is preferably filtered through a filter having a pore size of about 0.2 μm, for example. The total solid content concentration of the radiation-sensitive resin composition is typically 0.1% by mass to 50% by mass, preferably 0.5% by mass to 30% by mass, and more preferably 1% by mass to 20% by mass.

The radiation-sensitive resin composition may be employed for both positive tone pattern formation in which an alkaline developer solution is used, and negative tone pattern formation in which a developer solution containing an organic solvent is used. Of these, in the case of being employed for the negative tone pattern formation in which a developer solution containing an organic solvent is used, the radiation-sensitive resin composition is capable of resulting in higher resolution.

Resist Pattern-Forming Method

The resist pattern-forming method of the other embodiment of the present invention includes the steps of: forming a resist film (hereinafter, may be also referred to as "resist film-forming step"); exposing the resist film (hereinafter, may be also referred to as "exposure step"); and developing the resist film exposed (hereinafter, may be also referred to as "development step"). In the resist pattern-forming method, the resist film is formed from the radiation-sensitive resin composition of the embodiment described above.

Resist Film-Forming Step

In this step, the resist film is formed from the radiation-sensitive resin composition of the embodiment.

The substrate on which the resist film is to be formed is exemplified by a silicon wafer, a wafer coated with aluminum, and the like. The resist film is formed by applying the radiation-sensitive resin composition onto the substrate. Although an application procedure of the radiation-sensitive resin composition is not particularly limited, a known procedure such as e.g., spin-coating may be employed. In applying the radiation-sensitive resin composition, the amount of the radiation-sensitive resin composition applied is regulated such that the resist film to be formed has a desired thickness. It is to be noted that after the applying of the radiation-sensitive resin composition onto the substrate, soft baking (hereinafter, may be also referred to as "SB") may be carried out to evaporate off the solvent. The temperature of the soft baking is typically 30° C. to 200° C., and preferably 50° C. to 150° C.

Exposure Step

In this step, the resist film formed in the resist film-forming step is exposed. The exposure is carried out by liquid immersion lithography in which irradiation with a radioactive ray is conducted through a mask having a predetermined pattern via a liquid immersion medium such as water, as the case may be.

In the case of the liquid immersion lithography, the liquid immersion medium is placed on the resist film, and the resist film is irradiated with the radioactive ray via the liquid immersion medium. As the liquid immersion medium, a liquid having a refractive index greater than the air is typically used. Specific examples of the liquid immersion medium include pure water, long chain or cyclic aliphatic compounds, and the like. Via the liquid immersion medium, i.e., in a state in which a space between the lens and the resist film is filled with the liquid immersion medium, the resist film is exposed by irradiating with the radioactive ray from a lithography device, through a mask having a predetermined pattern.

Examples of the radioactive ray include: electromagnetic waves such as a visible light ray, an ultraviolet ray, a far ultraviolet ray, a vacuum ultraviolet ray (extreme ultraviolet ray (EUV); wavelength: 13.5 nm), an X-ray and a γ-ray; charged particle rays such as an electron beam and an α-ray; and the like. In the case of the liquid immersion lithography, far ultraviolet rays typified by an ArF excimer laser beam (wavelength: 193 nm) and a KrF excimer laser beam (wavelength: 248 nm) are preferred, and the ArF excimer laser beam (wavelength: 193 nm) is more preferred.

In addition, post exposure baking (PEB) may be carried out after the exposure. The lower limit of the temperature of PEB is typically 50° C., and preferably 80° C. The upper limit of the temperature of PEB is typically 180° C., and preferably 130° C. The lower limit of the time period of PEB is typically 5 sec, and preferably 10 sec. The upper limit of the time period of PEB is typically 600 sec, and preferably 300 sec.

In the embodiment of the present invention, in order to maximize the potential ability of the radiation-sensitive composition, for example, an organic or inorganic antireflective film may be formed on the substrate employed. In addition, in order to prevent influences of basic impurities etc., included in the environment atmosphere, a protective film may be also provided on the coating film, for example. Furthermore, in a case where an exposure by way of liquid immersion is carried out, in order to avoid direct contact of the film with the liquid immersion medium, a protective film for liquid immersion may be also provided on the film, for example.

Development Step

In this step, the resist film exposed in the exposure step is developed. The resist pattern is thus formed.

As the developer solution for use in the development, preferred examples of the alkaline developer solution include alkaline aqueous solutions prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene and 1,5-diazabicyclo-[4.3.0]-5-nonene. It is to be noted that the developer solution may contain, for example, a water soluble organic solvent, e.g., an alcohol such as methanol and ethanol as well as a surfactant, each in an appropriate amount.

Alternatively, a developer solution containing an organic solvent may be used as the developer solution. Exemplary organic solvents may include one, or two or more of the organic solvent exemplified for the solvent (E) of the radiation-sensitive resin composition.

EXAMPLES

Hereinafter, the present invention will be explained in detail by way of Examples, but the present invention is not in any way limited to these Examples. Measuring methods for various types of physical properties are shown below.

Weight Average Molecular Weight (Mw), Number Average Molecular Weight (Mn) and Dispersity Index (Mw/Mn)

The Mw and the Mn of the polymer were determined by gel permeation chromatography (GPC) by using GPC columns manufactured by Tosoh Corporation ("G2000HXL"×2; "G3000HXL"×1; and "G4000HXL"×1) under the following conditions. In addition, the dispersity index (Mw/Mn) was calculated from measurements of the Mw and Mn.

elution solvent: tetrahydrofuran flow rate: 1.0 mL/min sample concentration: 1.0% by mass amount of injected sample: 100 μL column temperature: 40° C.

detector: differential refractometer standard substance: mono-dispersed polystyrene $^{13}$C-NMR Analysis In the $^{13}$C-NMR analysis for determining the proportion of each structural unit of the polymer, a nuclear magnetic resonance apparatus (JEOL, Ltd., "JNM-ECX400") was used with deutero chloroform as a measurement solvent.

(A) Component (Acid Diffusion Control Agent)

Compounds represented by the following formulae (A-1) to (A-18) were used as the component (A) (acid diffusion control agent).

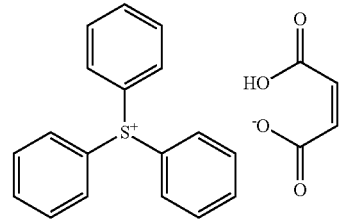

(A-1)

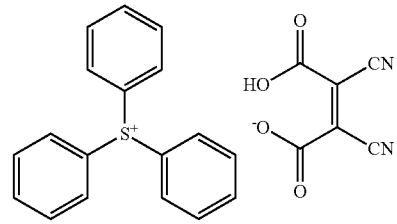

(A-2)

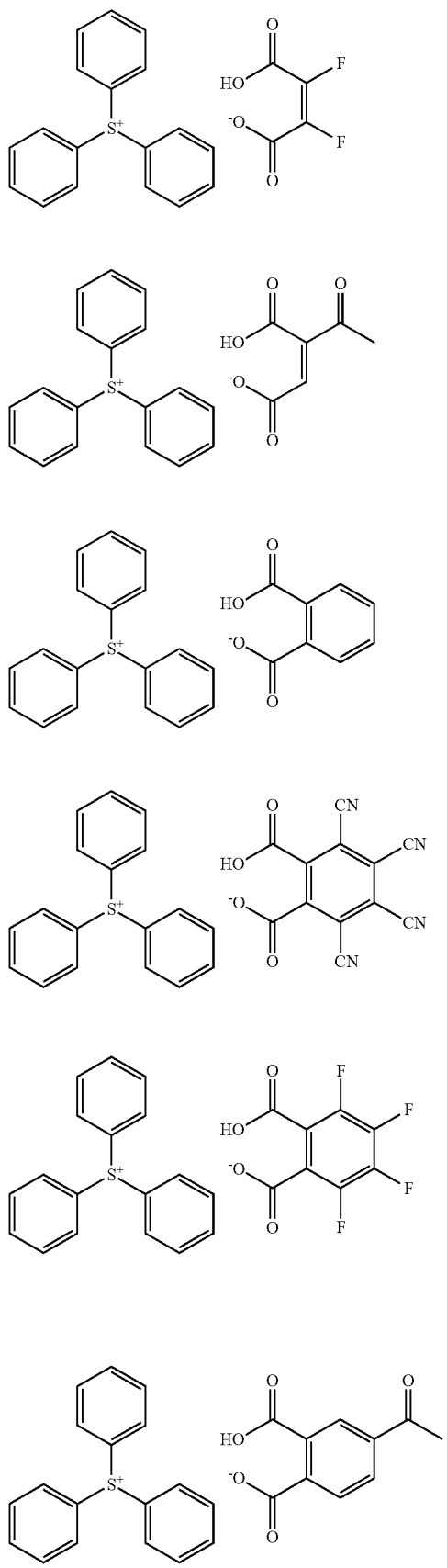

(A-15)
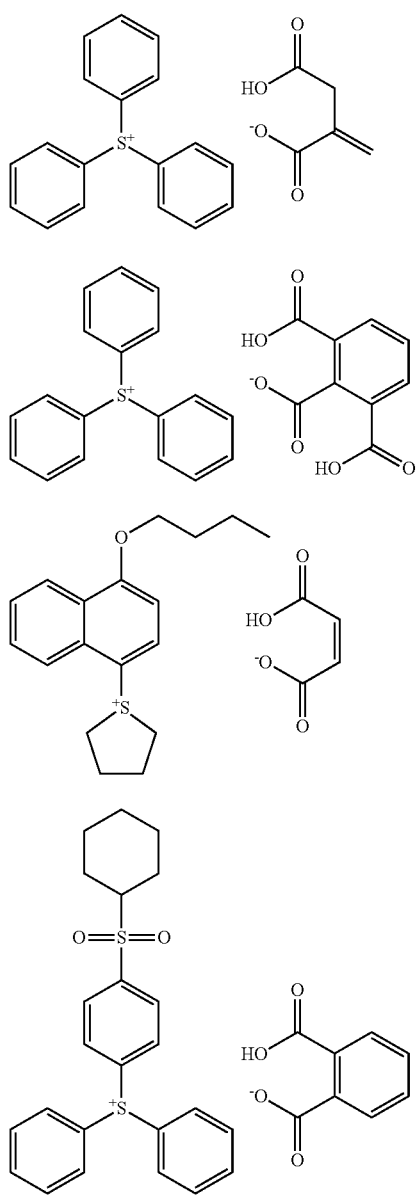
(A-16)
(A-17)
(A-18)
Synthesis of Polymer
The following monomers were provided for the syntheses of polymers of respective Examples and Comparative Examples.
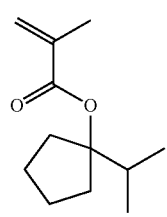
(M-1)
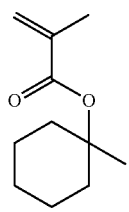
(M-2)
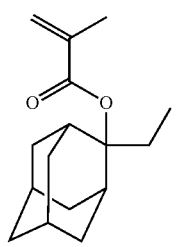
(M-3)
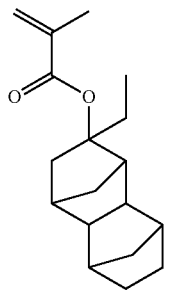
(M-4)
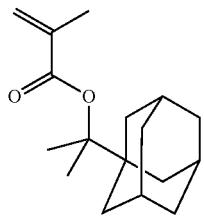
(M-5)
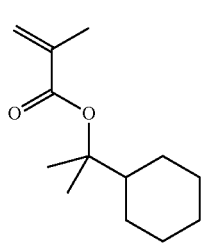
(M-6)
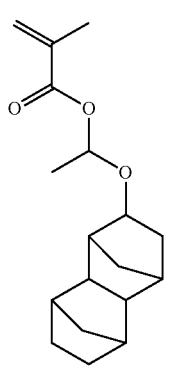
(M-7)

(M-8) 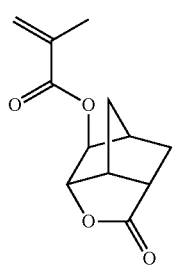
(M-9) 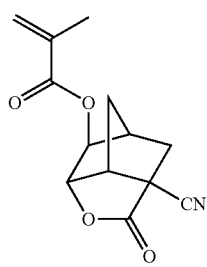
(M-10) 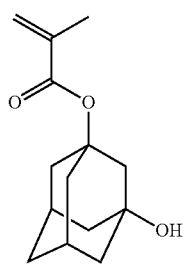
(M-11) 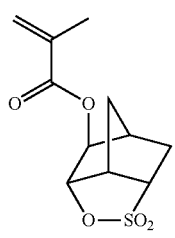
(M-12) 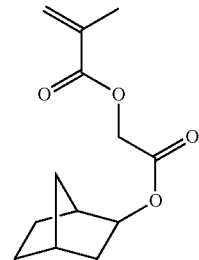
(M-13) 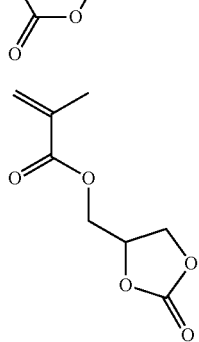
(M-14) 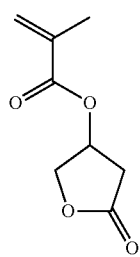
(M-15) 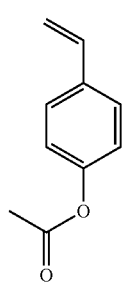
(M-16) 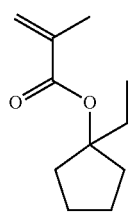
(M-17) 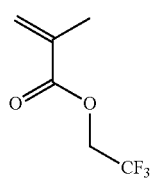
(M-18) 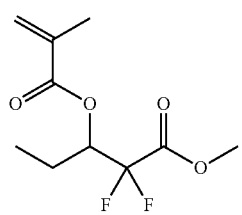
The compounds (M-1) to (M-7) and (M-16) each give the structural unit (IV), the compounds (M-8), (M-9) and (M-11) to (M-14) each give the structural unit (V), the compound (M-17) gives the structural unit (II), the compound (M-18) gives the structural unit (I), and the compounds (M-10) and (M-15) each give the other structural unit.

Synthesis of Polymer (D)

Synthesis Example 1: Synthesis of Polymer (D-1)

As shown in Table 1, 5.52 g (20 mol %) of the compound (M-16), 10.18 g (40 mol %) of the compound (M-17), and 14.30 g (40 mol %) of the compound (M-18) were dissolved in 20 g of 2-butanone, and then 1.24 g (5 mol % with respect to the total monomer) of azobisisobutyronitrile was further dissolved therein to prepare a monomer solution. Next, a 100-mL three-neck flask in which 10 g of 2-butanone had been placed was heated to 80° C. in a nitrogen atmosphere with stirring, and thereto was added the prepared monomer solution dropwise over 3 hrs. After completion of the dropwise addition, a polymerization reaction was allowed by additional heating at 80° C. for 3 hrs. After completion of the polymerization reaction, the reaction solution was cooled to room temperature. The reaction solution was transferred to a separatory funnel, and then homogenously diluted with 45 g of n-hexane, followed by mixing with 180 g of methanol. Next, 9 g of distilled water was charged, and the mixture was further stirred and left to stand for 30 min. Subsequently, the underlayer was recovered and the solvent was substituted with propylene glycol monomethyl ether acetate to give a propylene glycol monomethyl ether acetate solution containing a polymer (D-1) as a solid content (yield: 72.0%). The polymer (D-1) had the Mw of 7,300, and Mw/Mn of 2.00. As a result of the $^{13}$C-NMR analysis, the proportions of the structural units derived from the compound (M-16), the compound (M-17) and the compound (M-18) were 20.1 mol %, 38.9 mol % and 41.0 mol %, respectively.

separated solid by filtration was washed with 60 mL of methanol twice, and filtered off, followed by drying under a reduced pressure at 50° C. for 15 hrs to give a polymer (B-1) (yielding amount: 15.8 g; yield: 78.9%). The polymer (B-1) had the Mw of 6,100 and the Mw/Mn of 1.41. As a result of the $^{13}$C-NMR analysis, the proportions of the structural units derived from the compound (M-1) and the compound (M-8) were 49.8 mol % and 50.2 mol %, respectively.

Synthesis Examples 3 to 8: Synthesis of Polymers (B-2) to (B-7)

Polymers (B-2) to (B-7) shown in Table 2 below were synthesized by a similar operation to that of Synthesis Example 1 except that the monomers of the type and the amount shown in Table 2 were used. Total mass of the monomer was 20 g.

Synthesis Example 9: Synthesis of Polymer (B-8)

After 45.24 g (50 mol %) of the compound (M-15), 54.76 g (50 mol %) of the compound (M-1), and 4.58 g (5 mol % with respect to the total monomer) of azobisisobutyronitrile as an initiator and 1.14 g of t-dodecyl mercaptan were dissolved in 100 g of propylene glycol monomethyl ether, copolymerization was allowed in a nitrogen atmosphere, at a reaction temperature of 70° C. for 16 hrs. After completion of the polymerization reaction, the polymerization solution was added dropwise into 1,000 g of n-hexane to purify the polymer by solidification. Next, 150 g of propylene glycol monomethyl ether was again added to thus resulting solid, and further 150 g of methanol, 34 g of triethylamine and 6

TABLE 1

| (D) polymer | type | Monomer that gives structural unit (I) using amount (% by mole) | structural unit proportion of (% by mole) | type | Monomer that gives structural unit (II) using amount (% by mole) | structural unit proportion of (% by mole) | type | Monomer that gives structural unit (IV) using amount (% by mole) | structural unit proportion of (% by mole) | Yield (%) | Mw | Mw/Mn |
|---|---|---|---|---|---|---|---|---|---|---|---|---|
| Synthesis Example 1 | D-1 | M-18 | 40 | 41.0 | M-17 | 40 | 38.9 | M-16 | 20 | 20.1 | 72.0 | 7,300 | 2.00 |

Synthesis of Polymer (B)

Synthesis Example 2: Synthesis of Polymer (B-1)

In 40 g of 2-butanone, 9.38 g (50 mol %) of the compound (M-1) and 10.62 g (50 mol %) of the compound (M-8) were dissolved, and then 0.785 g (5 mol % with respect to the total monomer) of azobisisobutyronitrile was further dissolved therein to prepare a monomer solution. Next, a 200-mL three-neck flask in which 20 g of 2-butanone had been placed was heated to 80° C. in a nitrogen atmosphere with stirring, and thereto was added the prepared monomer solution dropwise over 3 hrs. After completion of the dropwise addition, a polymerization reaction was allowed by additional heating at 80° C. for 3 hrs. After completion of the polymerization reaction, the reaction solution was cooled to room temperature and charged into 300 g of methanol. Thus precipitated solid was filtered off. Thus g of water were added thereto. A hydrolysis reaction was allowed with refluxing at a boiling point for 8 hrs. After completion of the reaction, the solvent and triethylamine were distilled off under reduced pressure, and thus resultant solid was dissolved in 150 g of acetone. The mixture was then added into 2,000 g of water dropwise to permit solidification, and thus resultant solid was filtered off and dried overnight under a reduced pressure at 50° C. for 17 hrs to give a white powdery polymer (B-8) (yielding amount: 63.8 g; yield: 70.7%). The polymer (B-8) had the Mw of 6,400 and the Mw/Mn of 1.72. It is to be noted that the compound (M-15) gives a structural unit derived from p-hydroxystyrene in the polymer (B-8). As a result of the $^{13}$C-NMR analysis, the proportions of the structural unit derived from p-hydroxystyrene and the structural unit derived from the compound (M-1) were 51.2 mol % and 48.8 mol %, respectively. The proportion (mol %) of the structural unit of (M-15) in Table 2 indicates the proportion of the structural unit derived from p-hydroxystyrene.

TABLE 2

| (B) Polymer | type | Monomer that gives structural unit (IV) using amount (% by mole) | structural unit proportion of (% by mole) | Monomer that gives structural unit (V) or other structural unit type | using amount (% by mole) | structural unit proportion of (% by mole) | Yield (%) | Mw | Mw/Mn |
|---|---|---|---|---|---|---|---|---|---|
| Synthesis Example 2 | B-1 | M-1 | 50 | 49.8 | M-8 | 50 | 50.2 | 78.9 | 6,100 | 1.41 |
| Synthesis Example 3 | B-2 | M-2 | 50 | 50.4 | M-9 | 50 | 49.6 | 79.3 | 6,200 | 1.39 |
| Synthesis Example 4 | B-3 | M-3 | 50 | 48.9 | M-10 | 50 | 51.1 | 82.3 | 6,300 | 1.42 |
| Synthesis Example 5 | B-4 | M-4 | 50 | 49.5 | M-11 | 50 | 50.5 | 81.2 | 6,200 | 1.43 |
| Synthesis Example 6 | B-5 | M-5 | 50 | 49.7 | M-12 | 50 | 50.3 | 73.5 | 6,100 | 1.40 |
| Synthesis Example 7 | B-6 | M-6 | 50 | 50.2 | M-13 | 50 | 49.8 | 70.2 | 6,400 | 1.44 |
| Synthesis Example 8 | B-7 | M-7 | 50 | 49.2 | M-14 | 50 | 50.8 | 67.4 | 6,200 | 1.45 |
| Synthesis Example 9 | B-8 | M-1 | 50 | 51.2 | M-15 | 50 | 48.8 | 72.3 | 6,400 | 1.72 |

Preparation of Radiation-Sensitive Resin Composition

Other acid diffusion control agent (AA), the acid generating agent (C) and the solvent (E) used in preparing the radiation-sensitive resin compositions of Examples and Comparative Examples in the following are shown below.

(AA) Other Acid Diffusion Control Agent

Compounds represented by (AA-1) to (AA-2) were used as the other acid diffusion control agent (AA).

(AA-1)

(AA-2)

(C) Acid Generating Agent

Compounds represented by the following formulae (C-1) to (C-8) were used as the acid generating agent (C).

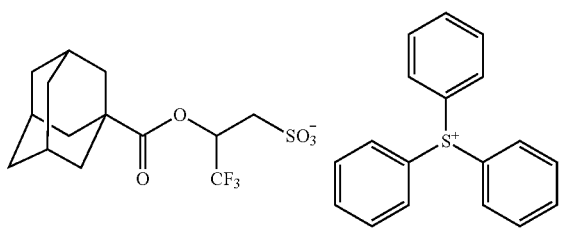

(C-1)

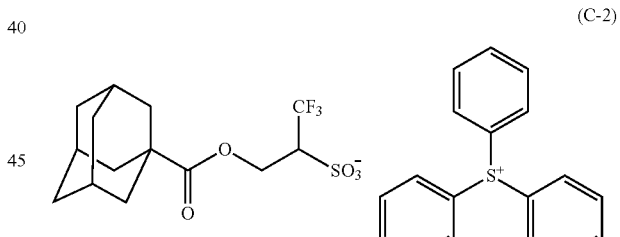

(C-2)

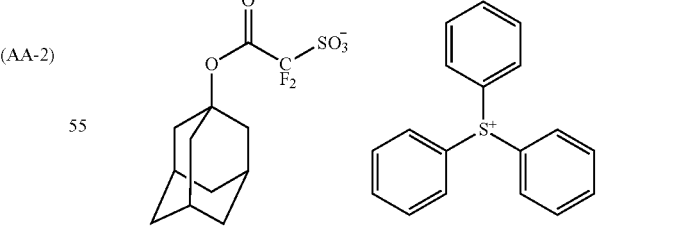

(C-3)

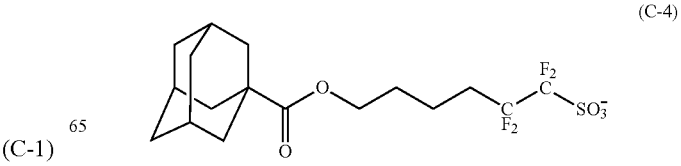

(C-4)

-continued

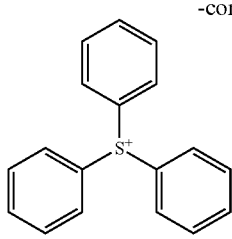
(C-5)

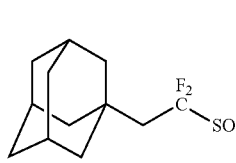
(C-6)

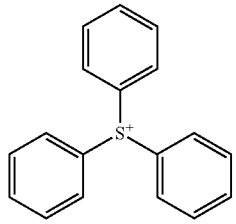

-continued

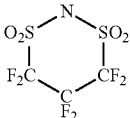
(C-7)

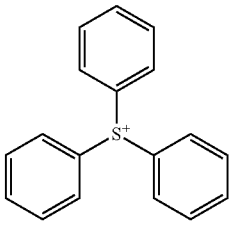

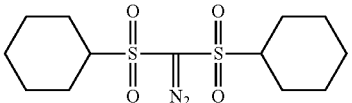
(C-8)

(E) Solvent
E-1: propylene glycol monomethyl ether acetate
E-2: cyclohexanone
E-3: γ-butyrolactone Preparation of Radiation-Sensitive Resin Composition for ArF Exposure Example 1

A radiation-sensitive resin composition of Example 1 was prepared by mixing 1.6 parts by mass of (A-1) as the component (A) (acid diffusion control agent), 3.0 parts by mass of (D-1) as the polymer (D), 100 parts by mass of (B-1) as the polymer (B), 7.9 parts by mass of (C-1) as the acid generating agent (C), and 2,240 parts by mass of (E-1), 960 parts by mass of (E-2) and 30 parts by mass of (E-3) each as the solvent (E), followed by filtering thus resulting mixed solution through a filter having a pore size of 0.20 µm.

Examples 2 to 32 and Comparative Examples 1 to 4

Radiation-sensitive resin compositions of Examples 2 to 32 and Comparative Examples 1 to 4 were prepared by a similar operation to that of Example 1 except that each component of the type and the amount shown in Tables 3 and 4 below was used.

TABLE 3

| | Radiation-sensitive resin composition | (A) Component type | content (parts by mass) | (B) Polymer type | content (parts by mass) | (C) Acid generating agent type | content (parts by mass) | (D) Polymer type | content (parts by mass) | (E) Solvent type | content (parts by mass) |
|---|---|---|---|---|---|---|---|---|---|---|---|
| Example 1 | J-1 | A-1 | 1.6 | B-1 | 100 | C-1 | 7.9 | D-1 | 3 | E-1/E-2/E-3 | 2,240/960/30 |
| Example 2 | J-2 | A-2 | 1.6 | B-1 | 100 | C-1 | 7.9 | D-1 | 3 | E-1/E-2/E-3 | 2,240/960/30 |
| Example 3 | J-3 | A-3 | 1.6 | B-1 | 100 | C-1 | 7.9 | D-1 | 3 | E-1/E-2/E-3 | 2,240/960/30 |
| Example 4 | J-4 | A-4 | 1.6 | B-1 | 100 | C-1 | 7.9 | D-1 | 3 | E-1/E-2/E-3 | 2,240/960/30 |
| Example 5 | J-5 | A-5 | 1.6 | B-1 | 100 | C-1 | 7.9 | D-1 | 3 | E-1/E-2/E-3 | 2,240/960/30 |
| Example 6 | J-6 | A-6 | 1.6 | B-1 | 100 | C-1 | 7.9 | D-1 | 3 | E-1/E-2/E-3 | 2,240/960/30 |
| Example 7 | J-7 | A-7 | 1.6 | B-1 | 100 | C-1 | 7.9 | D-1 | 3 | E-1/E-2/E-3 | 2,240/960/30 |
| Example 8 | J-8 | A-8 | 1.6 | B-1 | 100 | C-1 | 7.9 | D-1 | 3 | E-1/E-2/E-3 | 2,240/960/30 |
| Example 9 | J-9 | A-9 | 1.6 | B-1 | 100 | C-1 | 7.9 | D-1 | 3 | E-1/E-2/E-3 | 2,240/960/30 |
| Example 10 | J-10 | A-10 | 1.6 | B-1 | 100 | C-1 | 7.9 | D-1 | 3 | E-1/E-2/E-3 | 2,240/960/30 |
| Example 11 | J-11 | A-11 | 1.6 | B-1 | 100 | C-1 | 7.9 | D-1 | 3 | E-1/E-2/E-3 | 2,240/960/30 |
| Example 12 | J-12 | A-12 | 1.6 | B-1 | 100 | C-1 | 7.9 | D-1 | 3 | E-1/E-2/E-3 | 2,240/960/30 |
| Example 13 | J-13 | A-13 | 1.6 | B-1 | 100 | C-1 | 7.9 | D-1 | 3 | E-1/E-2/E-3 | 2,240/960/30 |
| Example 14 | J-14 | A-14 | 1.6 | B-1 | 100 | C-1 | 7.9 | D-1 | 3 | E-1/E-2/E-3 | 2,240/960/30 |
| Example 15 | J-15 | A-15 | 1.6 | B-1 | 100 | C-1 | 7.9 | D-1 | 3 | E-1/E-2/E-3 | 2,240/960/30 |
| Example 16 | J-16 | A-16 | 1.6 | B-1 | 100 | C-1 | 7.9 | D-1 | 3 | E-1/E-2/E-3 | 2,240/960/30 |

TABLE 3-continued

| | Radiation-sensitive resin composition | (A) Component type | (A) content (parts by mass) | (B) Polymer type | (B) content (parts by mass) | (C) Acid generating agent type | (C) content (parts by mass) | (D) Polymer type | (D) content (parts by mass) | (E) Solvent type | (E) content (parts by mass) |
|---|---|---|---|---|---|---|---|---|---|---|---|
| Example 17 | J-17 | A-17 | 1.6 | B-1 | 100 | C-1 | 7.9 | D-1 | 3 | E-1/E-2/E-3 | 2,240/960/30 |
| Example 18 | J-18 | A-18 | 1.6 | B-1 | 100 | C-1 | 7.9 | D-1 | 3 | E-1E-2/E-3 | 2,240/960/30 |

TABLE 4

| | Radiation-sensitive resin composition | (A) Component type | (A) content (parts by mass) | (B) Polymer type | (B) content (parts by mass) | (C) Acid generating agent type | (C) content (parts by mass) | (D) Polymer type | (D) content (parts by mass) | (E) Solvent type | (E) content (parts by mass) |
|---|---|---|---|---|---|---|---|---|---|---|---|
| Example 19 | J-19 | A-1 | 1.6 | B-2 | 100 | C-1 | 7.9 | D-1 | 3 | E-1/E-2/E-3 | 2,240/960/30 |
| Example 20 | J-20 | A-1 | 1.6 | B-3 | 100 | C-1 | 7.9 | D-1 | 3 | E-1/E-2/E-3 | 2,240/960/30 |
| Example 21 | J-21 | A-1 | 1.6 | B-4 | 100 | C-1 | 7.9 | D-1 | 3 | E-1/E-2/E-3 | 2,240/960/30 |
| Example 22 | J-22 | A-1 | 1.6 | B-5 | 100 | C-1 | 7.9 | D-1 | 3 | E-1/E-2/E-3 | 2,240/960/30 |
| Example 23 | J-23 | A-1 | 1.6 | B-6 | 100 | C-1 | 7.9 | D-1 | 3 | E-1/E-2/E-3 | 2,240/960/30 |
| Example 24 | J-24 | A-1 | 1.6 | B-7 | 100 | C-1 | 7.9 | D-1 | 3 | E-1/E-2/E-3 | 2,240/960/30 |
| Example 25 | J-25 | A-2 | 1.6 | B-1 | 100 | C-2 | 7.9 | D-1 | 3 | E-1/E-2/E-3 | 2,240/960/30 |
| Example 26 | J-26 | A-3 | 1.6 | B-1 | 100 | C-3 | 7.9 | D-1 | 3 | E-1/E-2/E-3 | 2,240/960/30 |
| Example 27 | J-27 | A-4 | 1.6 | B-1 | 100 | C-4 | 7.9 | D-1 | 3 | E-1/E-2/E-3 | 2,240/960/30 |
| Example 28 | J-28 | A-5 | 1.6 | B-1 | 100 | C-5 | 7.9 | D-1 | 3 | E-1/E-2/E-3 | 2,240/960/30 |
| Example 29 | J-29 | A-6 | 1.6 | B-1 | 100 | C-6 | 7.9 | D-1 | 3 | E-1/E-2/E-3 | 2,240/960/30 |
| Example 30 | J-30 | A-7 | 1.6 | B-1 | 100 | C-7 | 7.9 | D-1 | 3 | E-1/E-2/E-3 | 2,240/960/30 |
| Example 31 | J-31 | A-1 | 2.4 | B-1 | 100 | C-1 | 7.9 | D-1 | 3 | E-1/E-2/E-3 | 2,240/960/30 |
| Example 32 | J-32 | A-1 | 1.6 | B-1 | 100 | C-1 | 7.9 | — | — | E-1/E-2/E-3 | 2,240/960/30 |
| Comparative Example 1 | CJ-1 | AA-1 | 1.6 | B-1 | 100 | C-1 | 7.9 | D-1 | 3 | E-1/E-2/E-3 | 2,240/960/30 |
| Comparative Example 2 | CJ-2 | AA-2 | 1.6 | B-1 | 100 | C-1 | 7.9 | D-1 | 3 | E-1/E-2/E-3 | 2,240/960/30 |
| Comparative Example 3 | CJ-3 | A-1 | 1.6 | B-1 | 100 | C-8 | 7.9 | D-1 | 3 | E-1/E-2/E-3 | 2,240/960/30 |
| Comparative Example 4 | CJ-4 | A-1 | 1.6 | B-1 | 100 | C-8 | 7.9 | — | — | E-1/E-2/E-3 | 2,240/960/30 |

Resist Pattern Formation (1) by ArF Exposure and Development with Alkali

A composition for underlayer antireflective film formation (Brewer Science Co., Ltd., "ARC66") was applied onto the surface of a 12-inch silicon wafer by using a spin coater (Tokyo Electron Limited, "CLEAN TRACK ACT12"), and thereafter heated at 205° C. for 60 sec to form an underlayer antireflective film having an average thickness of 105 nm. On this underlayer antireflective film, each of the radiation-sensitive resin compositions of Examples 1 to 32 and Comparative Examples 1 to 4 prepared as aforementioned was applied by using the spin coater and subjected to PB at 90° C. for 60 sec. Thereafter, cooling was carried out at 23° C. for 30 sec to provide a resist film having an average film thickness of 90 nm. Next, the resist film was exposed using an ArF excimer laser Immersion Scanner (Nikon Corporation, "NSR-S610C") through a 40 nm line-and-space (1L/1S) mask pattern, under optical conditions involving NA of 1.3 and Dipole (σ=0.977/0.782). After the exposure, PEB was carried out at 90° C. for 60 sec. Thereafter, a development was carried out with a 2.38% by mass aqueous TMAH solution as an alkaline developer solution, followed by washing with water and drying to form a positive tone resist pattern. In this resist pattern formation, an exposure dose at which a 1:1 line-and-space with a line width of 40 nm was formed through a mask for a 1:1 line-and-space with a target dimension of 40 nm was designated as "optimum exposure dose (Eop)".

Resist Pattern Formation (2) by ArF Exposure and Development with Organic Solvent A negative tone resist pattern was formed in a similar manner to the Resist Pattern Formation (1) described above except that a development with an organic solvent was carried out by using n-butyl acetate in place of the aqueous TMAH solution and that washing with water was not carried out.

Evaluations

Each radiation-sensitive resin composition was evaluated on the resist pattern formed as described above in accordance with the following methods. The results of the evaluations are shown in Table 5 below. It is to be noted that a scanning electron microscope (Hitachi High-Technologies Corporation, "CG-5000") was used for the measurement of the line-width of the resist pattern.

MEEF

Line widths of the resist patterns resolved with five types of mask sizes (38.0 nm Line/80 nm Pitch; 39.0 nm Line/80 nm Pitch; 40.0 nm Line/80 nm Pitch; 41.0 nm Line/80 nm Pitch; and 42.0 nm Line/80 nm Pitch) at the aforementioned optimum exposure dose were measured. The measurements obtained were plotted for the mask size along the abscissa, and the line width formed with each mask size along the ordinate, and the slope of the approximate straight line calculated according to a least squares method was determined as "MEEF performance". A smaller measurement indicates more favorable MEEF.

Inhibitory Ability of Defects

On the resist pattern resolved at the optimum exposure dose, the number of defects was counted by using a defect inspection apparatus (KLA-Tencor Corporation, "KLA2810"). A more favorable inhibitory ability of defects is indicated as the number of defects per unit area is smaller. The inhibitory ability of defects may be evaluated to be: "favorable" in the case resulting in no greater than 0.1 number of defects/cm$^2$; and "unfavorable" in the case resulting in greater than 0.1 number of defects/cm$^2$.

Storage Stability

The radiation-sensitive resin composition immediately after the preparation, and the radiation-sensitive resin composition post-storage for three months at 25° C. after the preparation were examined on respective exposure doses (optimum exposure dose) at which the pattern formed through a 40-nm 1:1 line-and-space mask resulted in formation of the 1:1 line-and-space with a width of 40 nm. These optimum exposure doses were designated as Ea and Eb, respectively, and the marker of the storage stability was determined as "(Ea−Eb)×100/Ea. The storage stability may be evaluated to be: "favorable" in the case resulting in −1.00≤[(Ea−Eb)×100/Ea]≤1.00; and "unfavorable" in the case resulting in [(Ea−Eb)×100/Ea]<−1.00 or 1.00<[(Ea−Eb)×100/Ea].

LWR Performance

The resist pattern was observed from above the pattern by using the scanning electron microscope, and the line width was measured at 50 arbitrary points in total. A 3 Sigma value was determined from the distribution of the measurements, and this value was defined as "LWR performance (nm)". The smaller value indicates a more favorable LWR performance. The LWR performance may be evaluated to be: "favorable" in the case resulting in the value of no greater than 4.0 nm; and "unfavorable" in the case resulting in the value of greater than 4.0 nm.

Depth of Focus

On the resist pattern resolved at the optimum exposure dose, the dimension of a pattern formed when the focus was shifted along the depth direction was observed, a latitude in the depth direction in which the pattern dimension fell within the range of 90% to 110% of the basis without being accompanied by a bridge and/or residue was determined. The measurement result was defined as "depth of focus (nm)". The greater value indicates a more favorable depth of focus. The depth of focus may be evaluated to be: "favorable" in the case resulting in the value of no less than 60 nm; and "unfavorable" in the case resulting in the value of less than 60 nm.

The results of the evaluations of the resist patterns formed as described above of Examples 1 to 30 and Comparative Examples 1 to 2 (ArF exposure, development with an alkali) on MEEF, the inhibitory ability of defects and the storage stability are shown in Table 5 below.

TABLE 5

| | Radiation-sensitive resin composition | MEEF | Inhibitory ability of defects (number of defects/cm$^2$) | Storage stability (%) |
|---|---|---|---|---|
| Example 1 | J-1 | 3.41 | 0.01 | 0.45 |
| Example 2 | J-2 | 3.36 | 0.01 | 0.32 |
| Example 3 | J-3 | 3.35 | 0.01 | −0.29 |

TABLE 5-continued

| | Radiation-sensitive resin composition | MEEF | Inhibitory ability of defects (number of defects/cm$^2$) | Storage stability (%) |
|---|---|---|---|---|
| Example 4 | J-4 | 3.38 | 0.01 | 0.57 |
| Example 5 | J-5 | 3.13 | 0.01 | 0.31 |
| Example 6 | J-6 | 3.21 | 0.01 | 0.12 |
| Example 7 | J-7 | 3.24 | 0.01 | 0.24 |
| Example 8 | J-8 | 3.19 | 0.01 | 0.38 |
| Example 9 | J-9 | 3.23 | 0.01 | 0.14 |
| Example 10 | J-10 | 3.21 | 0.01 | −0.32 |
| Example 11 | J-11 | 3.21 | 0.01 | 0.04 |
| Example 12 | J-12 | 3.19 | 0.01 | −0.20 |
| Example 13 | J-13 | 3.24 | 0.01 | 0.53 |
| Example 14 | J-14 | 3.34 | 0.01 | −0.62 |
| Example 15 | J-15 | 3.38 | 0.01 | 0.22 |
| Example 16 | J-16 | 3.19 | 0.01 | 0.24 |
| Example 17 | J-17 | 3.39 | 0.01 | 0.38 |
| Example 18 | J-18 | 3.17 | 0.01 | 0.14 |
| Example 19 | J-19 | 3.32 | 0.01 | −0.32 |
| Example 20 | J-20 | 3.37 | 0.01 | 0.04 |
| Example 21 | J-21 | 3.40 | 0.01 | −0.20 |
| Example 22 | J-22 | 3.31 | 0.01 | 0.12 |
| Example 23 | J-23 | 3.33 | 0.01 | 0.36 |
| Example 24 | J-24 | 3.29 | 0.01 | −0.35 |
| Example 25 | J-25 | 3.43 | 0.01 | 0.23 |
| Example 26 | J-26 | 3.31 | 0.01 | 0.56 |
| Example 27 | J-27 | 3.15 | 0.01 | 0.24 |
| Example 28 | J-28 | 3.27 | 0.01 | −0.22 |
| Example 29 | J-29 | 3.11 | 0.01 | 0.50 |
| Example 30 | J-30 | 3.29 | 0.01 | 0.09 |
| Comparative Example 1 | CJ-1 | 3.29 | 4.21 | 4.91 |
| Comparative Example 2 | CJ-2 | 3.45 | 3.26 | 3.12 |

In addition, the results of the evaluations of the resist patterns formed as described above of Example 1, 31 and 32 and Comparative Examples 1 to 4 (ArF exposure, development with an alkali and development with an organic solvent) on the LWR performance and the depth of focus are shown in Table 6 below.

TABLE 6

| | Radiation-sensitive resin composition | Development with alkali | | Development with organic solvent | |
|---|---|---|---|---|---|
| | | LWR performance (nm) | depth of focus (nm) | LWR performance (nm) | depth of focus (nm) |
| Example 1 | J-1 | 3.21 | 90 | 3.35 | 80 |
| Example 31 | J-31 | 3.14 | 70 | 3.25 | 70 |
| Example 32 | J-32 | 3.23 | 70 | 3.31 | 70 |
| Comparative Example 1 | CJ-1 | 3.89 | 50 | 3.93 | 40 |
| Comparative Example 2 | CJ-2 | 3.85 | 50 | 4.01 | 50 |
| Comparative Example 3 | CJ-3 | 5.23 | 40 | 5.33 | 30 |
| Comparative Example 4 | CJ-4 | 5.45 | 30 | 5.22 | 30 |

Preparation of Radiation-Sensitive Resin Composition for Electron Beam Exposure

Example 33

A radiation-sensitive resin composition of Example 33 was prepared by blending 3.2 parts by mass of (A-1) as the component (A) (diffusion control agent), 3.0 parts by mass of (D-1) as the polymer (D), 100 parts by mass of (B-8) as the polymer (B), 20 parts by mass of (C-3) as the acid generating agent (C), and 4,280 parts by mass of (E-1) and 1,830 parts by mass of (E-2) each as the solvent (E), followed by filtering the mixture through a membrane filter having a pore size of 0.2 μm.

Examples 34 to 38 and Comparative Examples 5 to 8

Radiation-sensitive resin compositions of Examples 34 to 38 and Comparative Examples 5 to 8 were prepared by a similar operation to that of Example 33 except that each component of the type and the amount shown in Table 7 below was used.

mined as "MEEF performance". A smaller measurement indicates more favorable MEEF.

Inhibitory Ability of Defects

On the resist pattern resolved at the optimum exposure dose, the number of defects was counted by using a defect inspection apparatus (KLA-Tencor Corporation, "KLA2810"). A more favorable inhibitory ability of defects is indicated as the number of defects per unit area is smaller. The inhibitory ability of defects may be evaluated to be: "favorable" in the case resulting in no greater than 0.1 number of defects/$cm^2$; and "unfavorable" in the case resulting in greater than 0.1 number of defects/$cm^2$.

Storage Stability

The radiation-sensitive resin composition immediately after the preparation, and the radiation-sensitive resin com-

TABLE 7

| | Radiation-sensitive resin composition | (A) Component type | content (parts by mass) | (B) Polymer type | content (parts by mass) | (C) Acid generating agent type | content (parts by mass) | (D) Polymer type | content (parts by mass) | (E) Solvent type | content (parts by mass) |
|---|---|---|---|---|---|---|---|---|---|---|---|
| Example 33 | J-33 | A-1 | 3.2 | B-8 | 100 | C-3 | 20 | D-1 | 3 | E-1/E-2 | 4,280/1,830 |
| Example 34 | J-34 | A-3 | 3.2 | B-8 | 100 | C-4 | 20 | D-1 | 3 | E-1/E-2 | 4,280/1,830 |
| Example 35 | J-35 | A-5 | 3.2 | B-8 | 100 | C-6 | 20 | D-1 | 3 | E-1/E-2 | 4,280/1,830 |
| Example 36 | J-36 | A-14 | 3.2 | B-8 | 100 | C-7 | 20 | D-1 | 3 | E-1/E-2 | 4,280/1,830 |
| Example 37 | J-37 | A-1 | 4.8 | B-8 | 100 | C-3 | 20 | D-1 | 3 | E-1/E-2 | 4,280/1,830 |
| Example 38 | J-38 | A-14 | 3.2 | B-8 | 100 | C-7 | 20 | — | — | E-1/E-2 | 4,280/1,830 |
| Comparative Example 5 | CJ-5 | AA-1 | 3.2 | B-8 | 100 | C-3 | 20 | D-1 | 3 | E-1/E-2 | 4,280/1,830 |
| Comparative Example 6 | CJ-6 | AA-2 | 3.2 | B-8 | 100 | C-3 | 20 | D-1 | 3 | E-1/E-2 | 4,280/1,830 |
| Comparative Example 7 | CJ-7 | A-1 | 3.2 | B-8 | 100 | C-8 | 20 | D-1 | 3 | E-1/E-2 | 4,280/1,830 |
| Comparative Example 8 | CJ-8 | A-1 | 3.2 | B-8 | 100 | C-8 | 20 | — | — | E-1/E-2 | 4,280/1,830 |

Resist Pattern Formation (3) by Electron Beam Exposure and Development with Alkali Each radiation-sensitive resin composition shown in Table 7 was applied onto the surface of an 8-inch silicon wafer by using a spin coater (Tokyo Electron Limited, "CLEAN TRACK ACT8"), and then subjected to PB at 90° C. for 60 sec. Thereafter, the silicon wafer was cooled at 23° C. for 30 sec to form a resist film having an average thickness of 50 nm. Next, this resist film was irradiated with an electron beam by using a simplified electron beam writer (Hitachi, Ltd., "HL800D", output: 50 KeV, electric current density: 5.0 A/$cm^2$). After the irradiation, the resist film was subjected to PEB at 130° C. for 60 sec. Thereafter, the resist film was developed by using a 2.38% by mass aqueous TMAH solution as an alkaline developer solution at 23° C. for 30 sec, followed by washing with water and drying to form a positive tone resist pattern. In this resist pattern formation, an exposure dose at which a line-and-space with a line width of 100 nm was formed was designated as "optimum exposure dose (Eop)".

MEEF

Line widths of the resist patterns resolved with five types of mask sizes (142 nm Line/300 nm Pitch, 146 nm Line/300 nm Pitch, 150 nm Line/300 nm Pitch, 154 nm Line/300 nm Pitch, 158 nm Line/300 nm Pitch) at the aforementioned optimum exposure dose were measured. The measurements obtained were plotted for the mask size along the abscissa, and the line width formed with each mask size along the ordinate, and the slope of the approximate straight line calculated according to a least squares method was deterposition post-storage for three months at 25° C. after the preparation were examined on respective exposure doses (optimum exposure dose) at which the pattern formed through a 100-nm 1:1 line-and-space mask resulted in formation of the 1:1 line-and-space with a width of 100 nm. These optimum exposure doses were designated as Ea and Eb, respectively, and the marker of the storage stability was determined as "(Ea−Eb)×100/Ea. The storage stability may be evaluated to be: "favorable" in the case resulting in −1.00≤[(Ea−Eb)×100/Ea]≤1.00; and "unfavorable" in the case resulting in [(Ea−Eb)×100/Ea]<−1.00 or 1.00<[(Ea−Eb)×100/Ea].

In addition, evaluations of the resist patterns formed of Examples 33 to 36 and Comparative Examples 5 to 6 (electron beam exposure, development with an alkali) were made on the MEEF performance, the inhibitory ability of the defects and storage stability. The results of the evaluations are shown in Table 8 below. It is to be noted that the scanning electron microscope (Hitachi High-Technologies Corporation, "CG-4100") was used for the line-width measurement of the resist pattern.

TABLE 8

| | Radiation-sensitive resin composition | MEEF | Inhibitory ability of defects (number of defects/$cm^2$) | Storage stability (%) |
|---|---|---|---|---|
| Example 33 | J-33 | 2.01 | 0.01 | −0.14 |
| Example 34 | J-34 | 2.23 | 0.01 | −0.32 |

TABLE 8-continued

| | Radiation-sensitive resin composition | MEEF | Inhibitory ability of defects (number of defects/cm²) | Storage stability (%) |
|---|---|---|---|---|
| Example 35 | J-35 | 1.91 | 0.01 | 0.04 |
| Example 36 | J-36 | 2.32 | 0.01 | 0.22 |
| Comparative Example 5 | CJ-5 | 2.11 | 5.31 | 5.21 |
| Comparative Example 6 | CJ-6 | 2.01 | 4.25 | 4.55 |

Evaluations of the resist patterns formed of Example 33, 37 and 38 and Comparative Examples 5 to 8 (electron beam exposure, development with an alkali) were made on the sensitivity (μC/cm²) and the LWR performance in a similar manner to the case of the ArF exposure. The results of the evaluations are shown in Table 9 below. It is to be noted that the scanning electron microscope (Hitachi High-Technologies Corporation, "CG-4100") was used for the line-width measurement of the resist pattern. In the case of the electron beam exposure, the LWR performance may be evaluated to be: "favorable" in the case resulting in the value of no greater than 20 nm; and "unfavorable" in the case resulting in greater than, 20 nm.

TABLE 9

| | | Development with alkali | |
|---|---|---|---|
| | Radiation-sensitive resin composition | sensitivity (μC/cm²) | LWR performance (nm) |
| Example 33 | J-33 | 75 | 17 |
| Example 37 | J-37 | 77 | 16 |
| Example 38 | J-38 | 77 | 17 |
| Comparative Example 5 | CJ-5 | 95 | 25 |
| Comparative Example 6 | CJ-6 | 89 | 24 |
| Comparative Example 7 | CJ-7 | 125 | 26 |
| Comparative Example 8 | CJ-8 | 131 | 28 |

According to the radiation-sensitive resin composition and the resist pattern-forming method of the embodiments of the present invention, while a favorable MEEF performance is maintained forming a resist pattern superior in storage stability and inhibitory ability of development defects. Therefore, these can be suitably used in manufacture of semiconductor devices in which further progress of miniaturization is expected.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition, comprising:
a first compound represented by formula (1);
a first polymer comprising an acid-labile group and including a structural unit represented by formula (4); and
a radiation-sensitive acid generator other than the first compound, the radiation-sensitive acid generator comprising an onium salt compound,

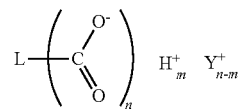

wherein, in the formula (1):

n is 2 or 3;

m is 1 or 2;

$Y^+$ represents a monovalent radiation-sensitive onium cation; and

L represents a single bond or an organic group having a valency of n, and includes linking moieties each linking two of the carboxylate groups in formula (1), number of atom(s) included in a linking moiety having a minimum number of bonds among the linking moieties being 0 to 10, wherein in a case where L represents a single bond, n is 2, and in a case where n is 2, m is 1,

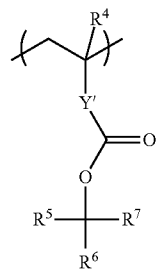

wherein, in the formula (4):

$R^4$ represents a hydrogen atom, a fluorine atom, a methyl group or a trifluoromethyl group;

$Y'$ represents a single bond, a carbonyloxyalkanediyl group having 2 to 20 carbon atoms, a carbonyloxycycloalkanediyl group having 4 to 20 carbon atoms, a carbonyloxycycloalkanediyloxy group having 4 to 20 carbon atoms, an arenediyl group having 6 to 20 carbon atoms or a carbonyloxyarenediyl group having 7 to 20 carbon atoms;

$R^5$ represents a hydrogen atom, a monovalent chain hydrocarbon group having 1 to 20 carbon atoms, a monovalent alicyclic hydrocarbon group having 3 to 20 carbon atoms or an aromatic hydrocarbon group having 6 to 20 carbon atoms;

$R^6$ and $R^7$ each independently represent a monovalent chain hydrocarbon group having 1 to 20 carbon atoms or a monovalent alicyclic hydrocarbon group having 3 to 20 carbon atoms, or $R^6$ and $R^7$ taken together represent an alicyclic structure having 3 to 20 ring atoms together with the carbon atom to which $R^6$ and $R^7$ bond.

2. The radiation-sensitive resin composition according to claim 1, further comprising a second polymer having a total percentage content by mass of fluorine atoms and silicon atoms greater than a total percentage content by mass of fluorine atoms and silicon atoms of the first polymer.

3. The radiation-sensitive resin composition according to claim 2, wherein the second polymer comprises an alkali-labile group.

4. The radiation-sensitive resin composition according to claim 3, wherein the second polymer comprises a structural unit represented by formula (2):

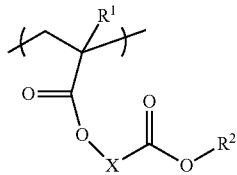
(2)

wherein, in the formula (2), $R^1$ represents a hydrogen atom, an alkyl group having 1 to 10 carbon atoms or an alkoxyalkyl group having 2 to 10 carbon atoms; X represents a divalent organic group having 1 to 20 carbon atoms; and $R^2$ represents a monovalent hydrocarbon group having 1 to 20 carbon atoms or a monovalent fluorinated hydrocarbon group having 1 to 20 carbon atoms, wherein at least one of X and $R^2$ represents a group comprising a fluorine atom.

5. The radiation-sensitive resin composition according to claim 1, wherein L in the formula (1) represents a single bond or a substituted or unsubstituted divalent hydrocarbon group having 1 to 20 carbon atoms.

6. The radiation-sensitive resin composition according to claim 1, wherein L in the formula (1) represents a single bond, or a group comprising 1 or 2 atom(s) in a linking moiety having the minimum number of bonds among the linking moieties each linking two of carboxylate groups.

7. The radiation-sensitive resin composition according to claim 1, wherein n in the formula (1) is 2, and L represents a substituted or unsubstituted 1,2-benzenediyl group or a substituted or unsubstituted 1,2-ethenediyl group.

8. The radiation-sensitive resin composition according to claim 1, wherein the first polymer includes a structural unit that includes at least one selected from the group consisting of a lactone structure, a cyclic carbonate structure and a sultone structure.

9. The radiation-sensitive resin composition according to claim 1, wherein the radiation-sensitive acid generator is included at a content of at least 3 parts by mass with respect to 100 parts by mass of the first polymer.

10. The radiation-sensitive resin composition according to claim 1, wherein the radiation-sensitive acid generator is included at a content of 3-15 parts by mass with respect to 100 parts by mass of the first polymer.

11. A radiation-sensitive resin composition, comprising:
a first compound represented by formula (1);
a first polymer comprising an acid-labile group; and
a radiation-sensitive acid generator other than the first compound, the radiation-sensitive acid generator comprising an onium salt compound,

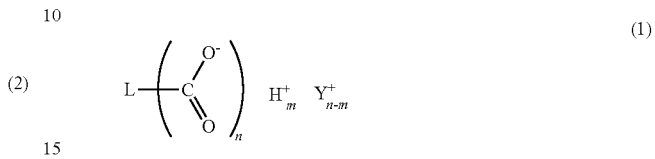
(1)

wherein, in the formula (1):
n is 2 or 3;
m is 1 or 2;
$Y^+$ represents a monovalent radiation-sensitive onium cation; and
L represents a single bond or an organic group having a valency of n, and includes linking moieties each linking two of the carboxylate groups in formula (1), number of atom(s) included in a linking moiety having a minimum number of bonds among the linking moieties being 0 to 10,
wherein in a case where L represents a single bond, n is 2, and in a case where n is 2, m is 1,
wherein the onium salt compound is represented by formula (vi):

(vi)

wherein, in the formula (vi), $R^{b1}$ represents a monovalent group comprising an alicyclic structure, or a monovalent group comprising an aliphatic hetero ring structure; $R^{b2}$ represents a fluorinated alkanediyl group having 1 to 10 carbon atoms; and $M^+$ represents a monovalent radioactive ray-degradable onium cation.

12. The radiation-sensitive resin composition according to claim 11, further comprising a second polymer having a total percentage content by mass of fluorine atoms and silicon atoms greater than a total percentage content by mass of fluorine atoms and silicon atoms of the first polymer.

13. The radiation-sensitive resin composition according to claim 12, wherein the second polymer comprises an alkali-labile group.

14. The radiation-sensitive resin composition according to claim 13, wherein the second polymer comprises a structural unit represented by formula (2):

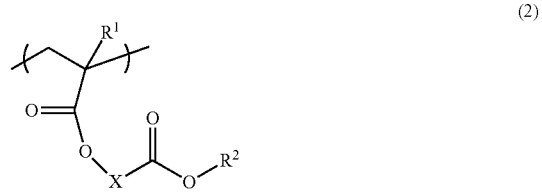
(2)

wherein, in the formula (2), $R^1$ represents a hydrogen atom, an alkyl group having 1 to 10 carbon atoms or an alkoxyalkyl group having 2 to 10 carbon atoms; X represents a divalent organic group having 1 to 20 carbon atoms; and $R^2$ represents a monovalent hydrocarbon group having 1 to 20 carbon atoms or a monovalent fluorinated hydrocarbon group having 1 to 20 carbon atoms, wherein at least one of X and $R^2$ represents a group comprising a fluorine atom.

15. The radiation-sensitive resin composition according to claim 11, wherein L in the formula (1) represents a single bond or a substituted or unsubstituted divalent hydrocarbon group having 1 to 20 carbon atoms.

16. The radiation-sensitive resin composition according to claim 11, wherein L in the formula (1) represents a single bond, or a group comprising 1 or 2 atom(s) in a linking moiety having the minimum number of bonds among the linking moieties each linking two of carboxylate groups.

17. The radiation-sensitive resin composition according to claim 11, wherein n in the formula (1) is 2, and L represents a substituted or unsubstituted 1,2-benzenediyl group or a substituted or unsubstituted 1,2-ethenediyl group.

18. The radiation-sensitive resin composition according to claim 11, wherein the first polymer includes a structural unit that includes at least one selected from the group consisting of a lactone structure, a cyclic carbonate structure and a sultone structure.

19. The radiation-sensitive resin composition according to claim 11, wherein the radiation-sensitive acid generator is included at a content of at least 3 parts by mass with respect to 100 parts by mass of the first polymer.

20. A resist pattern-forming method, comprising:
forming a resist film from a radiation-sensitive resin composition;
exposing the resist film; and
developing the resist film exposed,
wherein the radiation-sensitive resin composition includes
a first compound represented by formula (1),
a first polymer comprising an acid-labile group, and
a radiation-sensitive acid generator other than the first compound, the radiation-sensitive acid generator comprising an onium salt compound,

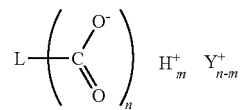

(1)

wherein, in the formula (1):
n is 2 or 3;
m is 1 or 2;
$Y^+$ represents a monovalent radiation-sensitive onium cation; and
L represents a single bond or an organic group having a valency of n, and includes linking moieties each linking two of the carboxylate groups in formula (1), number of atom(s) included in a linking moiety having a minimum number of bonds among the linking moieties being 0 to 10,
wherein in a case where L represents a single bond, n is 2, and in a case where n is 2, m is 1.

* * * * *